(12) United States Patent
Balakrishnan et al.

(10) Patent No.: US 9,653,465 B1
(45) Date of Patent: May 16, 2017

(54) VERTICAL TRANSISTORS HAVING DIFFERENT GATE LENGTHS

(71) Applicant: International Business Machines Corporation, Armonk, NY (US)

(72) Inventors: Karthik Balakrishnan, White Plains, NY (US); Pouya Hashemi, White Plains, NY (US); Tak H. Ning, Yorktown Heights, NY (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/262,347

(22) Filed: Sep. 12, 2016

(51) Int. Cl.
| | | |
|---|---|---|
| *H01L 21/8238* | (2006.01) | |
| *H01L 29/66* | (2006.01) | |
| *H01L 27/092* | (2006.01) | |
| *H01L 21/265* | (2006.01) | |
| *H01L 27/088* | (2006.01) | |
| *H01L 29/167* | (2006.01) | |

(52) U.S. Cl.
CPC .... *H01L 27/0922* (2013.01); *H01L 21/26513* (2013.01); *H01L 27/0886* (2013.01); *H01L 29/167* (2013.01); *H01L 29/66545* (2013.01)

(58) Field of Classification Search
CPC ..... H01L 21/823431; H01L 21/823821; H01L 29/66795; H01L 29/786; H01L 29/7858; H01L 29/7856
See application file for complete search history.

(56) References Cited

U.S. PATENT DOCUMENTS 9,508,833 B1 * 11/2016 Leobandung ..... H01L 21/76224
9,525,038 B2 * 12/2016 Masuoka ......... H01L 21/28114

* cited by examiner

*Primary Examiner* — Cuong Q Nguyen
(74) *Attorney, Agent, or Firm* — Cantor Colburn LLP; Louis Percello

(57) ABSTRACT

A method of forming a semiconductor device and resulting structures having vertical transistors with different gate lengths are provided. A sacrificial gate is formed over a channel region of a semiconductor fin. The sacrificial gate includes a first material. The first material in a first portion of the sacrificial gate adjacent to the semiconductor fin is converted to a second material, the first portion having a first depth. The first portion of the sacrificial gate is then removed.

16 Claims, 23 Drawing Sheets

VERTICAL TRANSISTORS HAVING DIFFERENT GATE LENGTHS

BACKGROUND

The present invention relates in general to semiconductor device fabrication methods and resulting structures. More specifically, the present invention relates to fabrication methods and resulting structures for a semiconductor device having vertical transistors with different gate lengths.

In contemporary semiconductor device fabrication processes, a large number of semiconductor devices, such as field effect transistors (FETs), are fabricated on a single wafer. Some non-planar transistor device architectures, such as vertical field effect transistors (VFETs), employ semiconductor fins and side-gates that can be contacted outside the active region, resulting in increased device density and some increased performance over lateral devices. In contemporary VFET devices, in contrast to conventional FETs, the source to drain current flows through a vertical pillar in a direction that is perpendicular with respect to a horizontal major surface of the wafer or substrate. A VFET can achieve a smaller device footprint because its channel length is decoupled from the contacted gate pitch.

SUMMARY

According to embodiments of the present invention, a method of fabricating a semiconductor device having vertical transistors with different gate lengths is provided. The method can include forming a sacrificial gate over a channel region of a semiconductor fin. The sacrificial gate includes a first material. The first material in a first portion of the sacrificial gate adjacent to the semiconductor fin is converted to a second material, the first portion having a first depth. The first portion of the sacrificial gate is then removed.

According to embodiments of the present invention, a method of fabricating a semiconductor device having vertical transistors with different gate lengths is provided. The method can include forming a sacrificial gate over a channel region of a first semiconductor fin and a channel region of a second semiconductor fin, the sacrificial gate having a first material. The first material in a first portion of the sacrificial gate adjacent to the first semiconductor fin is converted to a second material, the first portion having a first depth. The first material in a second portion of the sacrificial gate adjacent to the second semiconductor fin is converted to the second material, the second portion having a second depth. The first portion and the second portion of the sacrificial gate are then removed. The first depth and the second depth are different.

According to embodiments of the present invention, a structure having vertical transistors with different gate lengths is provided. The structure can include a first semiconductor fin formed on a first portion of a doped region of a substrate and a second semiconductor fin formed on a second portion of the doped region of the substrate, the first portion and the second portion of the doped region separated by an isolation region. A first gate is formed over a channel region of the first semiconductor fin, the channel region of the first semiconductor fin having a first length, the first length determined by a first implant energy. A second gate is formed over a channel region of the second semiconductor fin, the channel region of the second semiconductor fin having a second length, the second length determined by a second implant energy. The first implant energy and the second implant energy are different and the first length and the second length are different.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
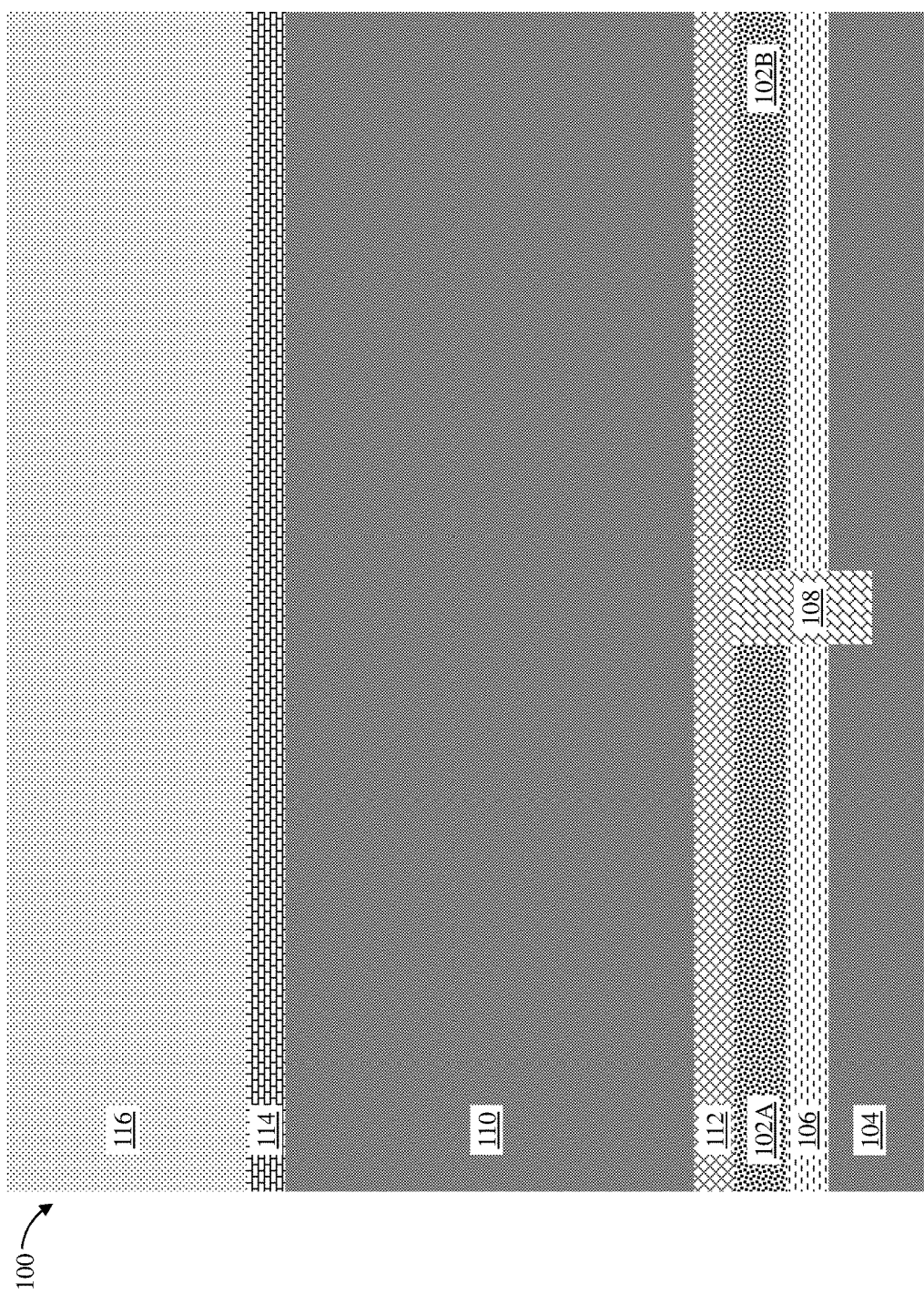
FIG. 1 depicts a cross-sectional view of a structure having a doped region formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop. The term "about" is intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having closely packed vertical transistors with reduced contact resistance according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. A wet etch process, such as a buffered hydrofluoric acid (BHF) etch, is a material removal process that uses liquid chemicals or etchants to remove materials from a surface. A dry etch process, such as reactive ion etching (RIE), uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, as previously noted herein, some non-planar transistor device architectures, such as VFETs, employ semiconductor fins and side-gates that can be contacted outside the active region, resulting in increased device density over lateral devices. However, there are challenges to providing VFETs with equal or superior performance characteristics to lateral devices. For example, providing a VFET architecture having multiple gate lengths is challenging due to the complicated topography created. Multiple gate length devices are desirable because these devices allow for a precise power vs performance tuning. Furthermore, as the features of a VFET are reduced in size and increased in aspect ratio, it can be increasingly difficult to overcome these topography complications. Thus, a method and structure is desired for a semiconductor device having vertical transistors with different gate lengths.

Turning now to an overview of aspects of the present invention, one or more embodiments provide methods of fabricating a semiconductor device having vertical transistors with different gate lengths. The described methods employ a selective ion implantation of a sacrificial gate material followed by selectively removing the implanted portion of the sacrificial gate material. As the implant energy of the ion implantation can be very well controlled the corresponding implantation depth can be precisely set. A patterned hard mask is opened to expose a portion of the sacrificial gate material for a particular transistor to a specific implant energy. The implant energy is selected to achieve a desired implantation depth. The process can be repeated by opening the hard mask over other transistors and applying different implant energies to achieve various desired implantation depths for portions of the sacrificial gate material adjacent to each transistor. The implanted portions of the sacrificial gate are then removed. In this manner, a controlled channel length is provided for each transistor. Methods for forming vertical transistors with different gate lengths and the resulting structures therefrom in accordance with embodiments of the present invention are described in detail below by referring to the accompanying drawings in FIGS. 1-23.

FIG. 1 illustrates a cross-sectional view of a structure 100 having a doped region 102 formed on a substrate 104 during an intermediate operation of a method of fabricating a semiconductor device according to one or more embodiments. The doped region 102 can be a source or drain region formed on the substrate 104 by a variety of methods, such as, for example, diffusion, ion implantation of a dopant into the substrate, or in-situ doped epitaxy. The substrate 104 can be any suitable substrate material, such as, for example, monocrystalline Si, SiGe, SiC, III-V compound semiconductor, II-VI compound semiconductor, or semiconductor-on-insulator (SOI). In some embodiments, a counter-doped layer 106 is formed between the doped region 102 and the substrate 104.

In some embodiments, a shallow trench isolation (STI) region 108 is formed separating the doped layer 102 into a first portion 102A and a second portion 102B. A STI region prevents electrical current leak between adjacent semiconductor device components. The STI region 108 can be of any suitable material, such as, for example, an oxide. In some embodiments, the STI region 108 is formed by a CMP to remove any excess portion of the STI region 108 (known as overburden) that extends above a top surface of the doped region 102.

A sacrificial gate 110 is formed between a bottom spacer 112 and a top spacer 114 on the doped layer 102 and the STI region 108. Any known composition and manner of forming the sacrificial gate 110 can be utilized. In some embodiments, the sacrificial gate 110 can be amorphous silicon (a-Si) or polycrystalline silicon (poly-Si). Any known manner of forming the bottom spacer 112 and the top spacer 114 can be utilized. In some embodiments, the bottom spacer 112 and the top spacer 114 are each deposited using CVD, PECVD, ALD, PVD, chemical solution deposition, or other like processes. The bottom spacer 112 and the top spacer 114 can be of any suitable material, such as, for example, a low-k dielectric, a nitride, silicon nitride, silicon dioxide, a silicon oxynitride (SiON), a silicon carbide (SiC), a silicon oxygen carbonitride (SiOCN), or a silicoboron carbonitride (SiBCN). In some embodiments, the bottom spacer 112 and the top spacer 114 are different materials. A sacrificial layer 116 is formed on the top spacer 114. In some embodiments, the sacrificial layer 116 is an oxide.

Figure 2:
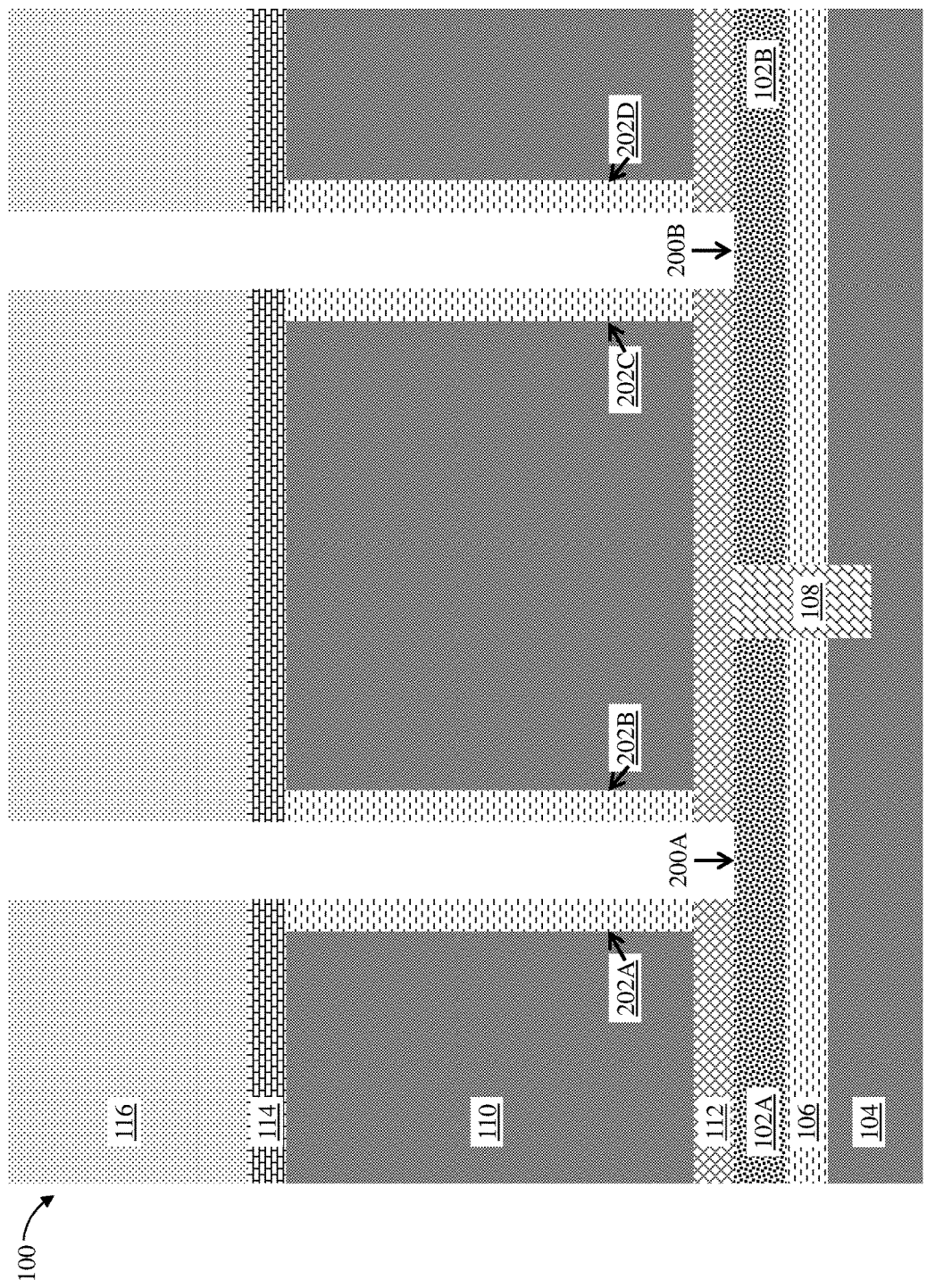
FIG. 2 depicts the cross-sectional view of the structure after removing portions of a sacrificial layer, portions of a top spacer, portions of a sacrificial gate, and portions of a bottom spacer to expose surfaces of the doped region according to one or more embodiments of the present invention.

FIG. 2 illustrates a cross-sectional view of the structure 100 after removing portions of the sacrificial layer 116, portions of the top spacer 114, portions of the sacrificial gate 110, and portions of the bottom spacer 112 to expose a surface 200A of the doped region 102A and a surface 200B of the doped region 102B. Any known manner of removing these portions can be utilized. In some embodiments, an etch process, which can be a wet etch process, a dry etch process or a combination thereof, is utilized. In some embodiments, the etch process is a directional etch, such as a RIE, selective to the doped region 102. In some embodiments, the etch process is a series of directional etches (e.g., RIEs) having a final etch selective to the doped region 102. In some embodiments, thin oxide layers 202A, 202B, 202C, and 202D are formed by oxidizing exposed sidewalls of the sacrificial gate 110. Any known manner of oxidizing exposed sidewalls of the sacrificial gate 110 can be used, such as, for example, a plasma oxidation process.

Figure 3:
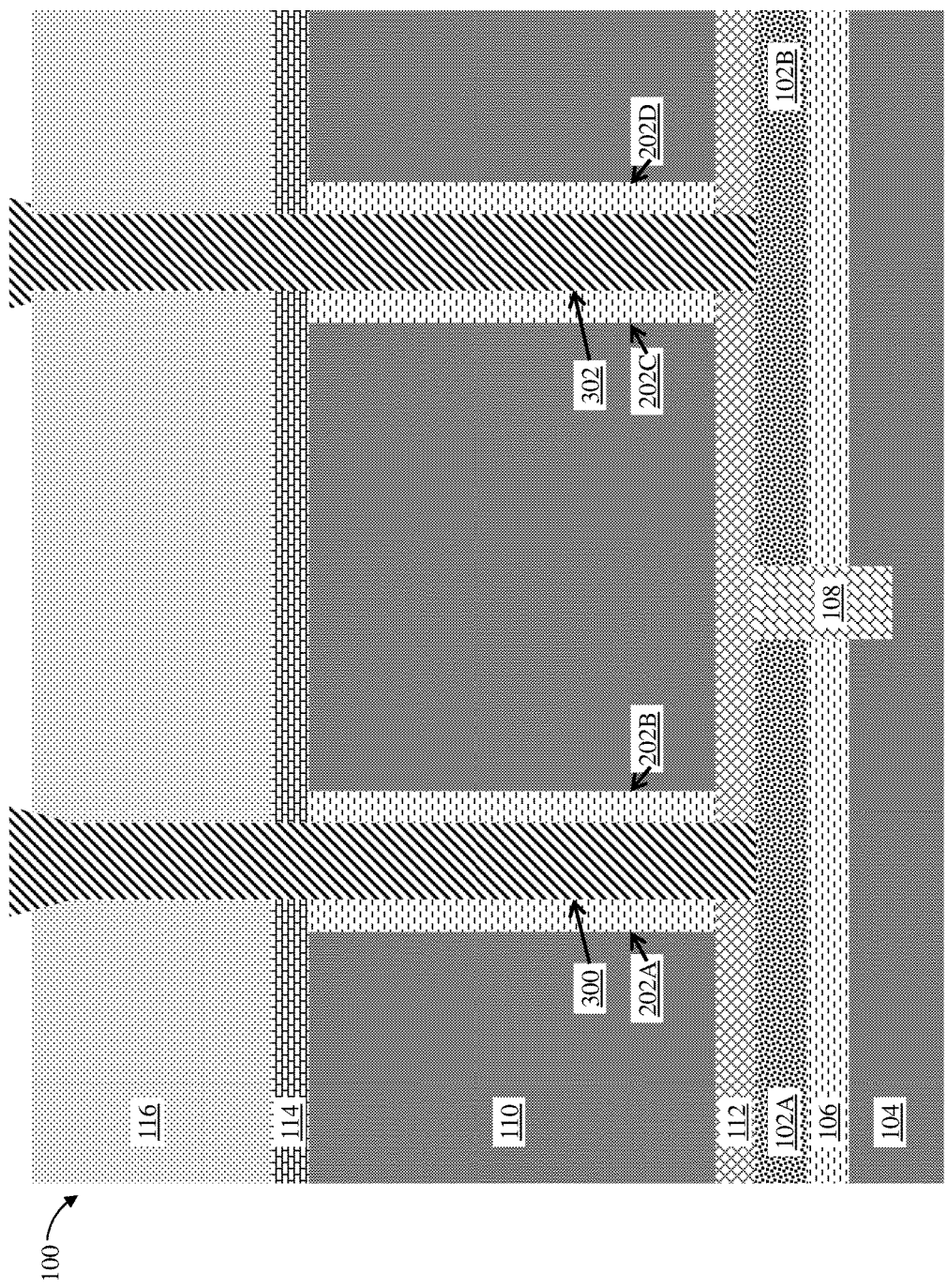
FIG. 3 depicts the cross-sectional view of the structure after forming a first semiconductor fin and a second semiconductor fin on portions of the doped layer according to one or more embodiments of the present invention.

FIG. 3 illustrates a cross-sectional view of the structure 100 after forming a first semiconductor fin 300 and a second semiconductor fin 302 on the first portion 102A and the second portion 102B of the doped layer 102, respectively. For ease of illustration and discussion, only semiconductor fins 300 and 302 are shown. It is understood that any number of semiconductor fins can be formed on separate portions of the doped region 102, each portion separated by an STI region. Any known manner of forming the semiconductor fins can be utilized. In some embodiments, the semiconductor fins are epitaxially grown on the exposed surfaces 200A and 200B of the doped region 102 (depicted in FIG. 2). In some embodiments, the semiconductor fins are grown until a portion of each of the semiconductor fins extends beyond a top surface of the sacrificial layer 116. In some embodiments, the semiconductor fins are formed using ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), or molecular beam epitaxy (MBE). Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process.

The semiconductor fins 300 and 302 can be any suitable material, such as, for example, Si, SiGe, Group III-V channel material, or other suitable channel materials. Group III-V channel materials include materials having at least one group III element and at least one group V element, such as, for example, one or more of aluminum gallium arsenide, aluminum gallium nitride, aluminum arsenide, aluminum indium arsenide, aluminum nitride, gallium antimonide, gallium aluminum antimonide, gallium arsenide, gallium arsenide antimonide, gallium nitride, indium antimonide, indium arsenide, indium gallium arsenide, indium gallium arsenide phosphide, indium gallium nitride, indium nitride, indium phosphide and alloy combinations including at least one of the foregoing materials. In some embodiments, the fin pitch, or spacing, between each semiconductor fin can be about 20 nm to about 100 nm. In other embodiments, the fin pitch is about 30 nm to about 50 nm. In still other embodiments, the fin pitch is greater than about 100 nm.

Figure 4:
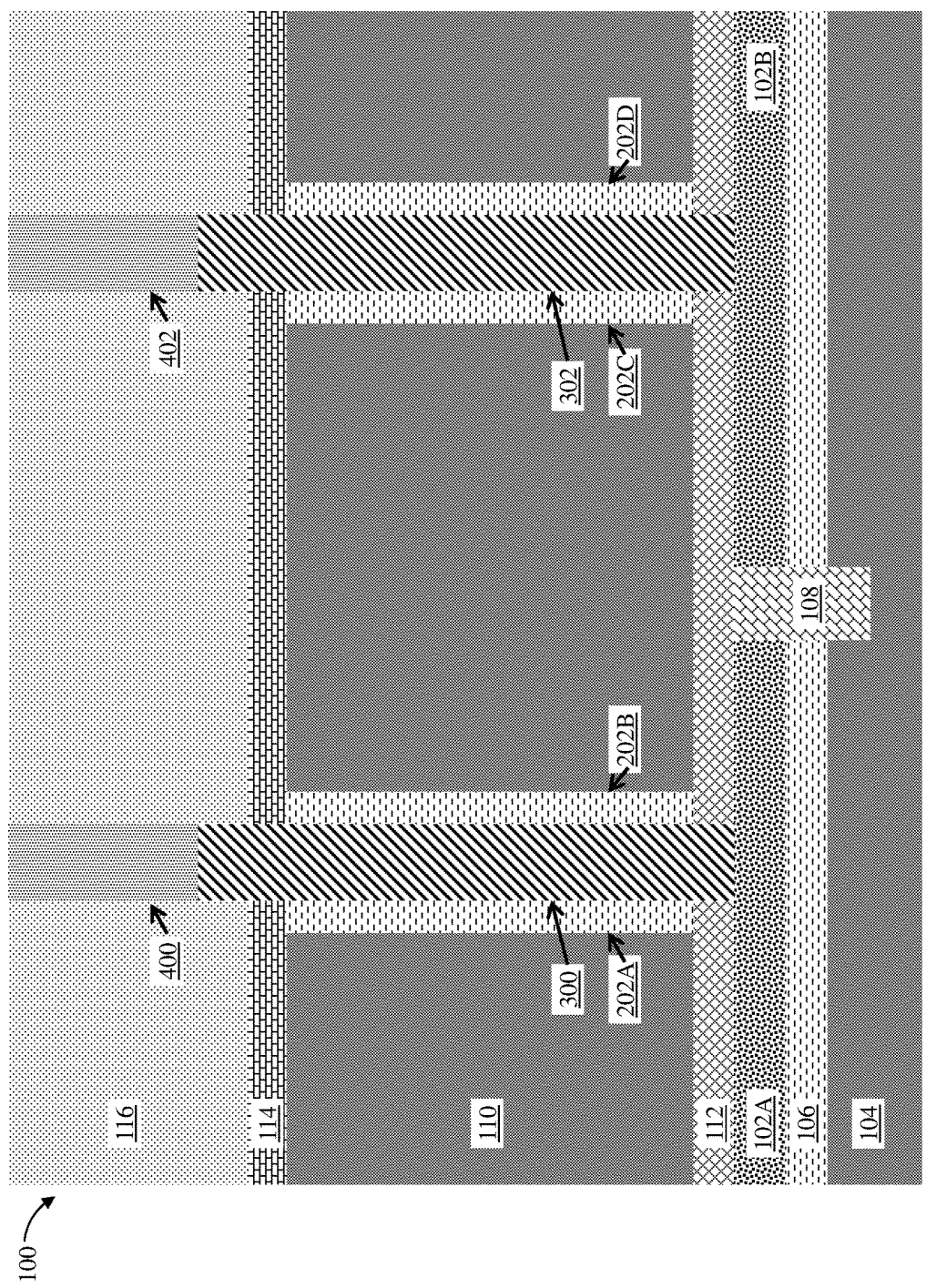
FIG. 4 depicts the cross-sectional view of the structure after planarizing the semiconductor fins selective to the sacrificial layer according to one or more embodiments of the present invention.

FIG. 4 illustrates a cross-sectional view of the structure 100 after planarizing the semiconductor fins 300 and 302 selective to the sacrificial layer 116. Any known method of planarization can be used, such as, for example, CMP. The semiconductor fins 300 and 302 are then recessed below a surface of the sacrificial layer 116. Hard masks 400 and 402 are formed on the semiconductor fins 300 and 302, respectfully. The hard masks 400 and 402 can be any suitable material, such as, for example, a nitride or silicon nitride. The hard masks 400 and 402 are planarized selective to the sacrificial layer 116.

Figure 5:
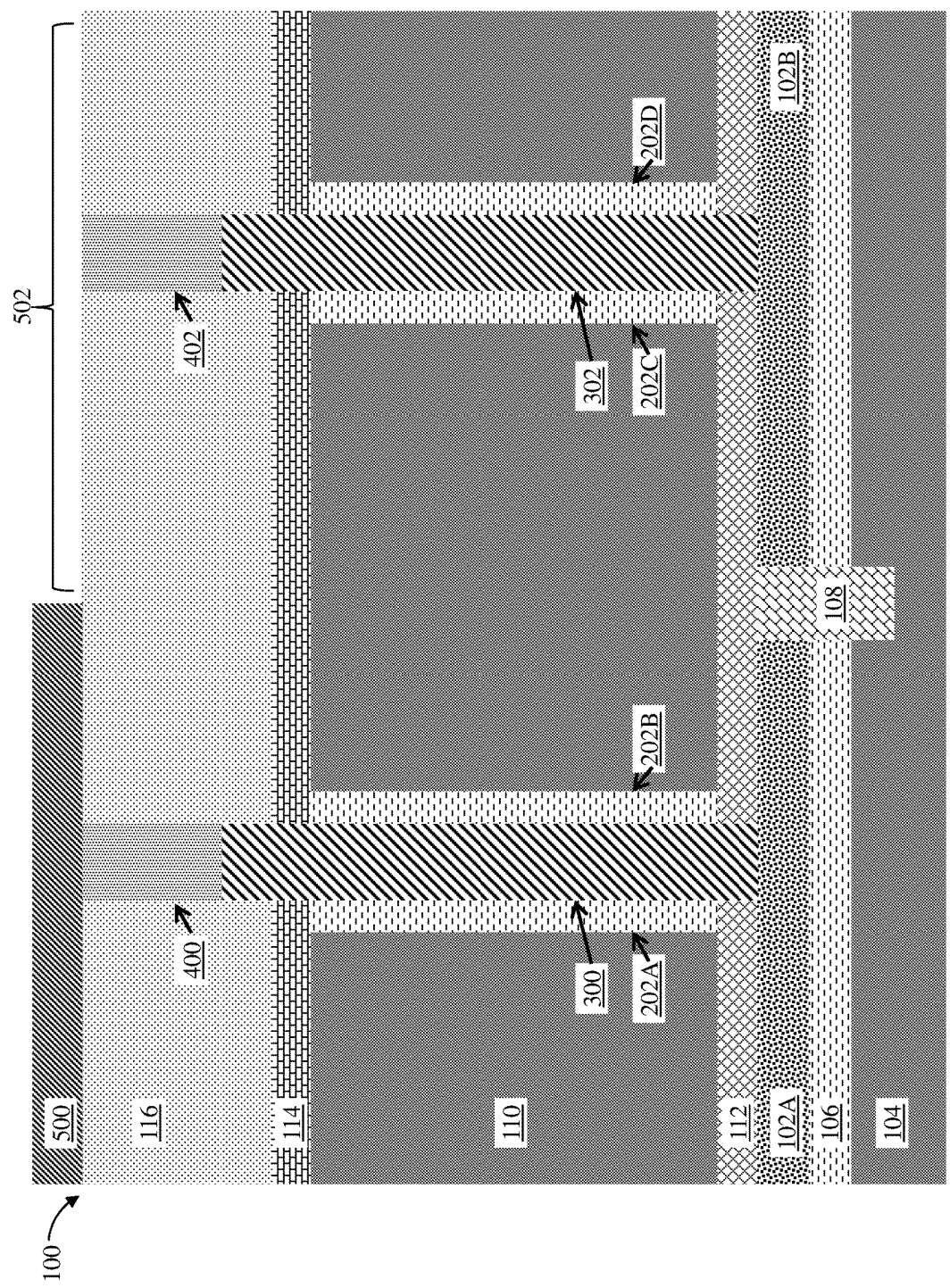
FIG. 5 depicts the cross-sectional view of the structure after forming a hard mask on the sacrificial layer according to one or more embodiments of the present invention.

FIG. 5 illustrates a cross-sectional view of the structure 100 after forming a hard mask 500 on the sacrificial layer 166 and the hard mask 400. The hard mask 500 is patterned with an opening 502 exposing a portion of the sacrificial layer 116 and a surface of the hard mask 402. The opening defines a processing window for the semiconductor fin 302. In some embodiments, the opening 502 extends to adjacent STI regions on opposite sides of the semiconductor fin 302 (e.g., region 108 and an unillustrated STI region).

Figure 6:
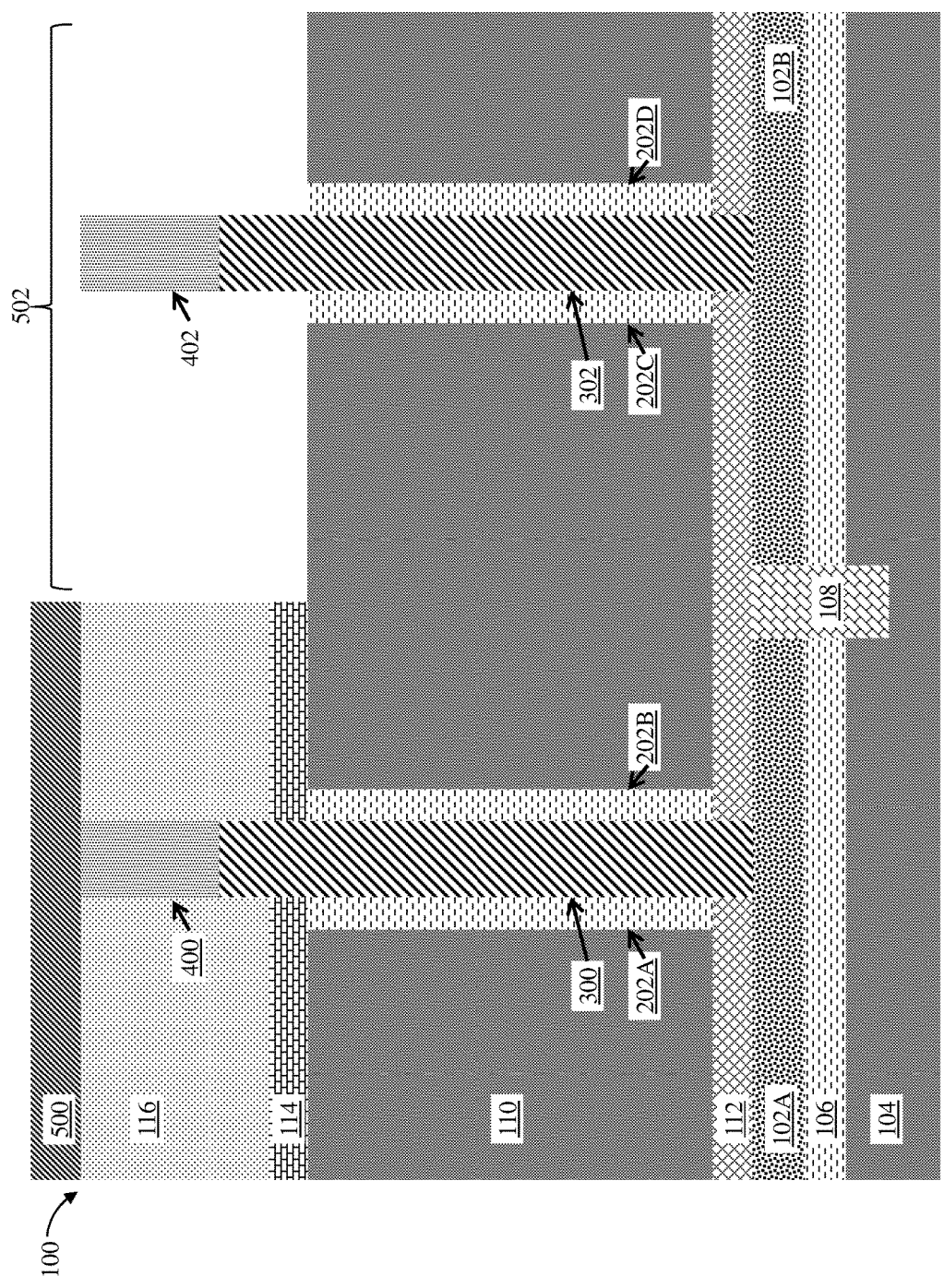
FIG. 6 depicts the cross-sectional view of the structure after removing exposed portions of the sacrificial layer and portions of the top spacer within an opening to expose a portion of the sacrificial gate according to one or more embodiments of the present invention.

FIG. 6 illustrates a cross-sectional view of the structure 100 after removing the exposed portions of the sacrificial layer 116 and portions of the top spacer 114 within the opening 502 to expose a portion of the sacrificial gate 110. Any known manner of removing these portions can be utilized. In some embodiments, an etch process, which can be a wet etch process, a dry etch process or a combination thereof, is utilized. In some embodiments, the etch process is a directional etch, such as a RIE, selective to the sacrificial gate 110.

Figure 7:
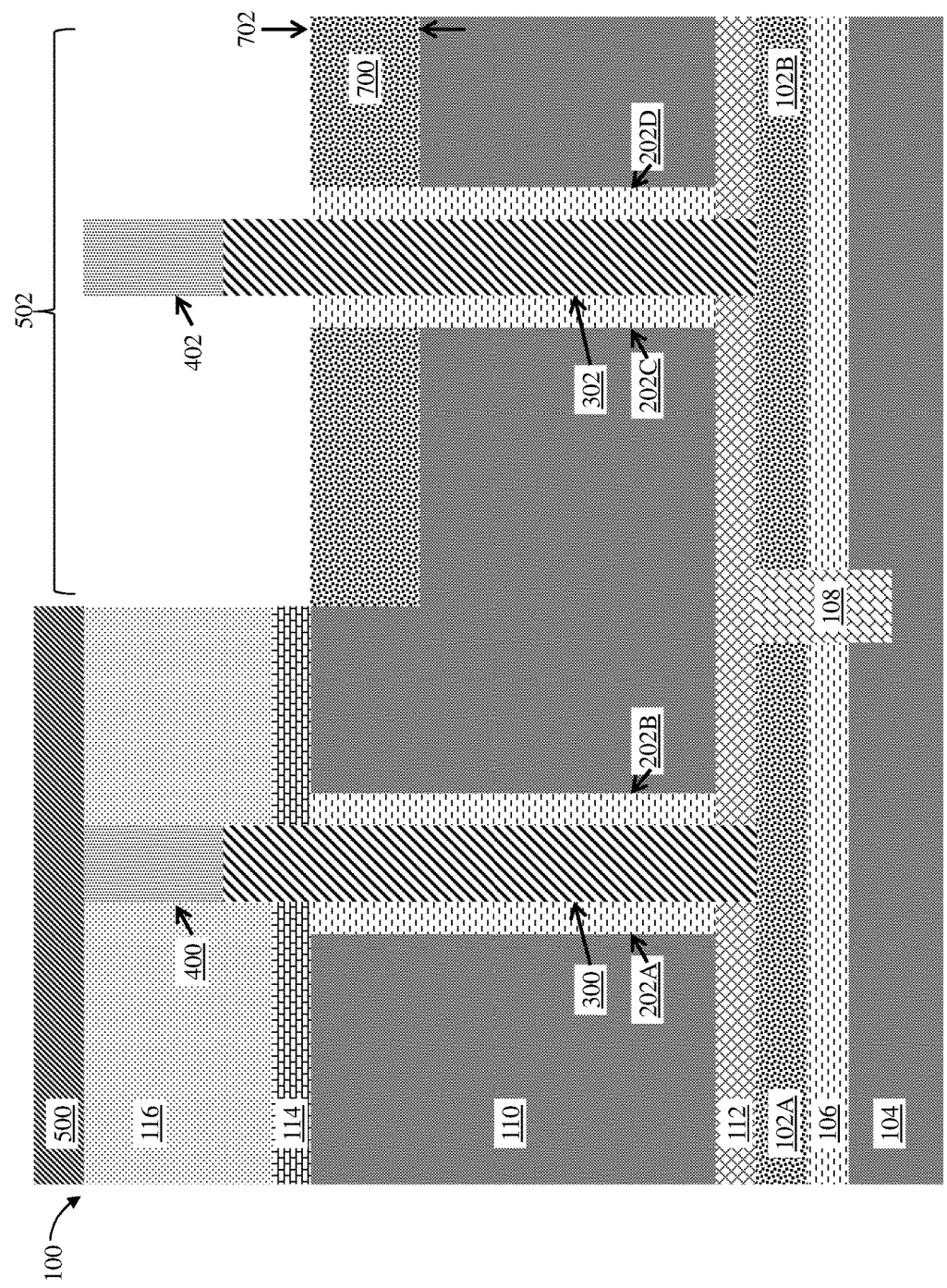
FIG. 7 depicts the cross-sectional view of the structure after an ion implantation process forms an implanted region having a depth in the exposed portions of the sacrificial gate according to one or more embodiments of the present invention.

FIG. 7 illustrates a cross-sectional view of the structure 100 after an ion implantation process forms an implanted region 700 having a depth 702 in the exposed portions of the sacrificial gate 110. The depth 702 of the implanted region 700 can be controlled by adjusting an implant energy of the ion implantation process. For example, the implant energy can be increased to increase the depth 702. Conversely, the implant energy can be decreased to decrease the depth 702. As the implant energy of the ion implantation process can be very well controlled the depth 702 can be precisely tuned to achieve a desired depth. In some embodiments, the depth 702 is about 10 nm to about 40 nm.

In some embodiments, the sacrificial gate 110 is amorphous silicon and the ion implantation process includes an arsenic ion implantation dose of about $1.00 \times 10^{15}$ ions/cm$^{-2}$ to about $2.00 \times 10^{16}$ ions/cm$^{-2}$. The ion implantation process dopes the amorphous silicon in the implanted region 700 with arsenic to form arsenic doped silicon (Si:As). In some embodiments, the ion implantation process is between 1-15 KeV and room temperature.

In some embodiments, the sacrificial gate 110 is amorphous silicon and the ion implantation process includes a germanium ion implantation dose of about $1.00 \times 10^{16}$ ions/cm$^{-2}$ to about $2.00 \times 10^{17}$ ions/cm$^{-2}$. The ion implantation process dopes the amorphous silicon in the implanted region 700 with germanium to form germanium doped silicon (Si:Ge).

Figure 8:
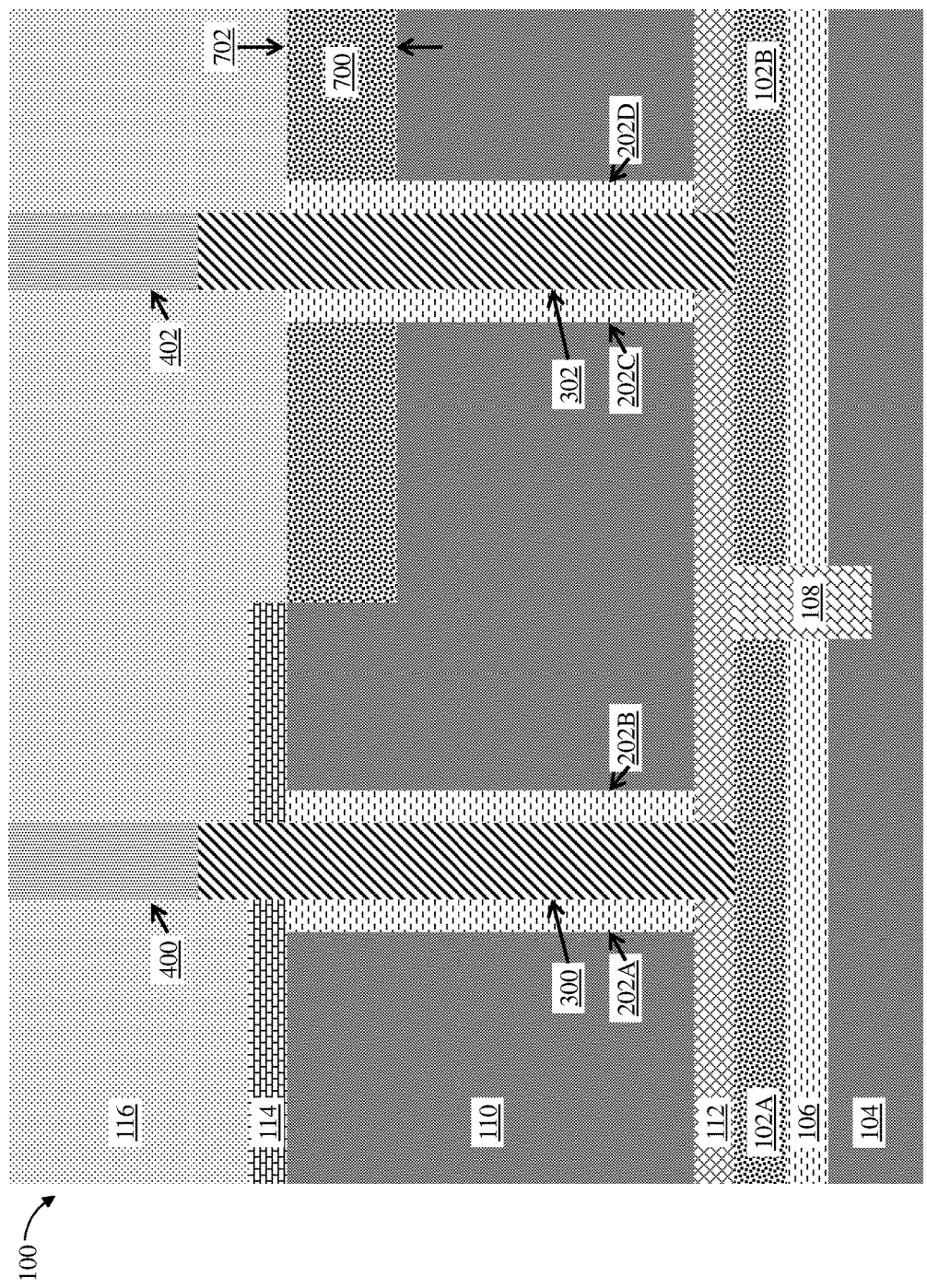
FIG. 8 depicts the cross-sectional view of the structure after removing the hard mask and re-filling the opening with sacrificial layer material according to one or more embodiments of the present invention.

FIG. 8 illustrates a cross-sectional view of the structure 100 after removing the hard mask 500 and re-filling the opening 502 with sacrificial layer 116 material. In some embodiments, the opening 502 is re-filled with a sacrificial layer having a different material than the sacrificial layer 116 (not illustrated).

Figure 9:
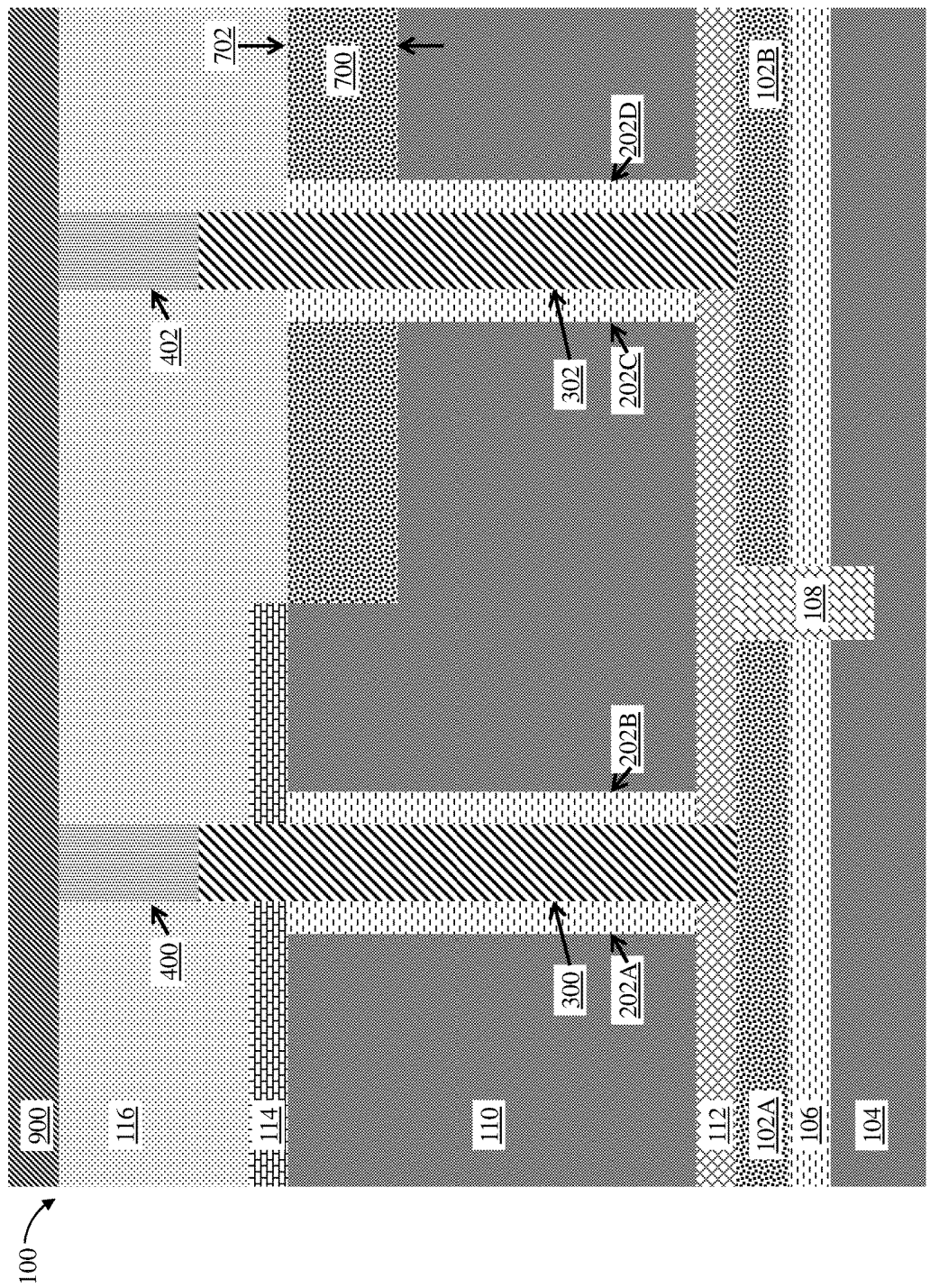
FIG. 9 depicts the cross-sectional view of the structure after forming a hard mask over the sacrificial layer according to one or more embodiments of the present invention.

FIG. 9 illustrates a cross-sectional view of the structure 100 after forming a hard mask 900 over the sacrificial layer 116, the hard mask 400, and the hard mask 402. In some embodiments, the hard mask 900 is patterned with an opening over another semiconductor fin (not illustrated) in a like manner as the hard mask 500 was patterned with opening 502. As discussed previously herein, these hard mask openings define processing windows for each of the semiconductor fins whereby a portion of the sacrificial gate 110 can be selectively implanted. In some embodiments, the structure 100 includes a plurality of semiconductor fins and the process of opening a portion of a hard mask, implanting a portion of the sacrificial gate 110 using an ion implantation process, and re-forming a hard mask is repeated for each semiconductor fin. By adjusting the implant energy used for each ion implantation process a plurality of implanted regions having a plurality of depths can be formed.

Figure 10:
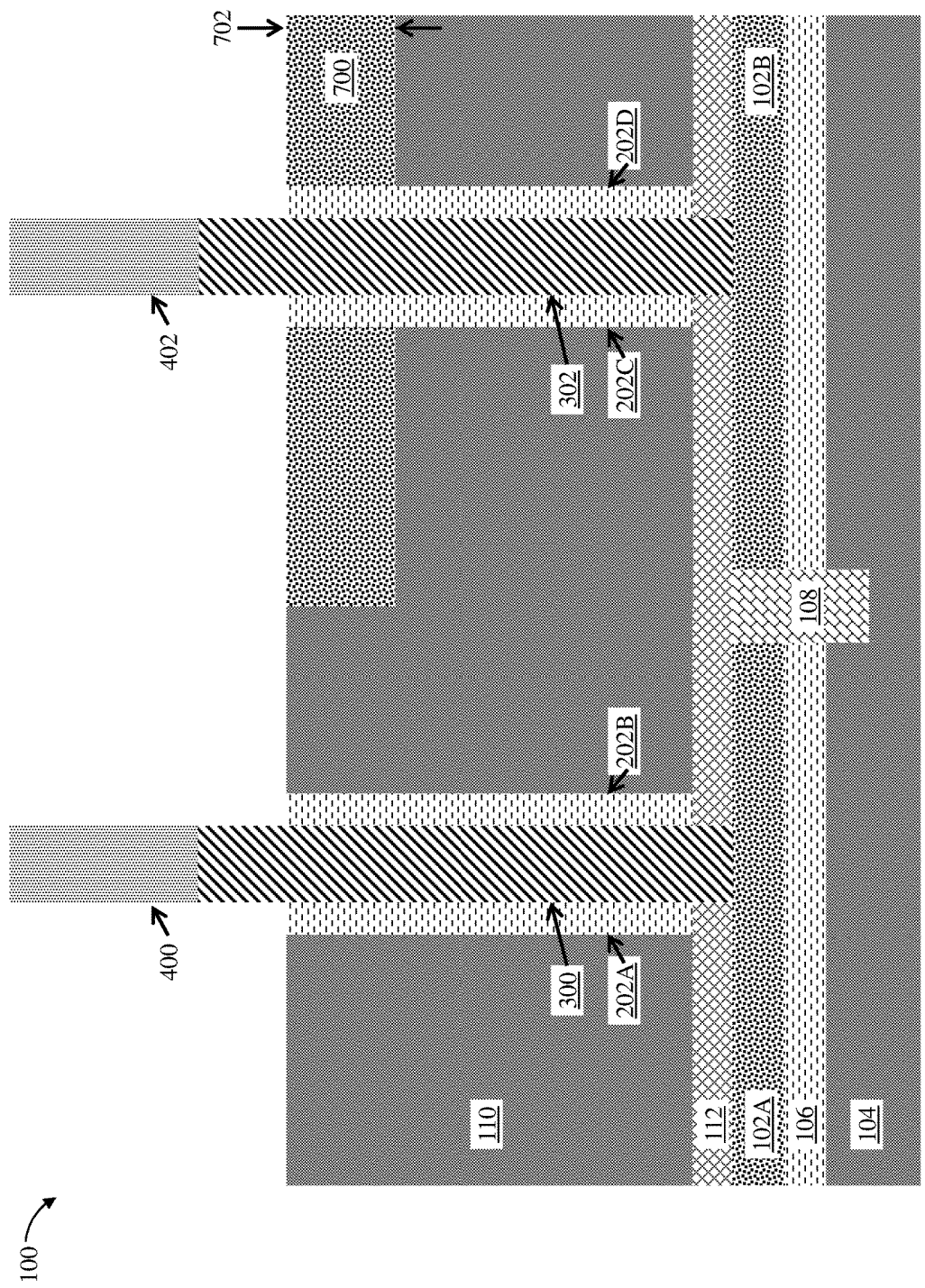
FIG. 10 depicts the cross-sectional view of the structure after removing the hard mask, the sacrificial layer, and the top spacer to expose a surface of the sacrificial gate and a surface of the implanted region according to one or more embodiments of the present invention.

FIG. 10 illustrates a cross-sectional view of the structure 100 after removing the hard mask 900, the sacrificial layer 116, and the top spacer 114 to expose a surface of the sacrificial gate 110 and a surface of the implanted region 700. Any known manner of removing the hard mask 900, the sacrificial layer 116, and the top spacer 114 can be utilized. In some embodiments, an etch process, which can be a wet etch process, a dry etch process or a combination thereof, is utilized. In some embodiments, the etch process is a directional etch, such as a RIE, selective to the sacrificial gate 110 and the implanted region 700. In some embodiments, the etch process is a series of directional etches (e.g., RIEs) having a final etch selective to the sacrificial gate 110 and/or the implanted region 700.

Figure 11:
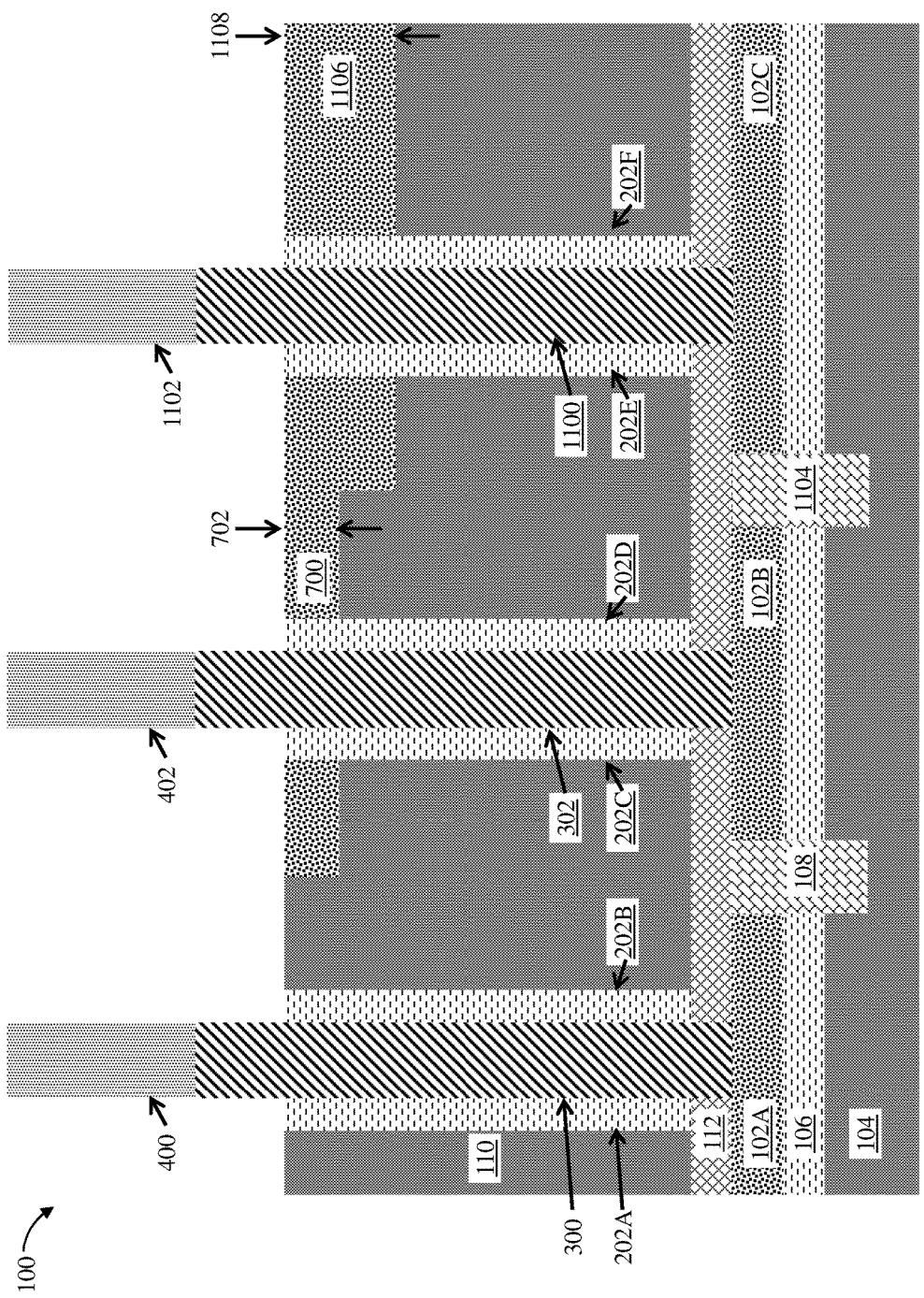
FIG. 11 depicts an extended cross-sectional view of the structure after removing the hard mask, the sacrificial layer, and the top spacer as discussed above for FIG. 10 according to one or more embodiments of the present invention.

FIG. 11 illustrates an extended cross-sectional view of the structure 100 after removing the hard mask 900, the sacrificial layer 116, and the top spacer 114 as discussed above for FIG. 10. This view depicts an additional semiconductor fin 1100 having a hard mask 1102 formed on a third portion 102C of the doped layer 102 separated from the other portions of the doped layer 102 by a STI region 1104. The semiconductor fin 1100 includes thin oxide layers 202E and 202F formed in like manner and composition as the thin oxide layers 202A, 202B, 202C, and 202D for semiconductor fins 300 and 302. An ion implantation process forms an implanted region 1106 having a depth 1108 in the exposed portions of the sacrificial gate 110. An implant energy of the ion implantation process can be adjusted to control the depth 1108 in like manner as the depth 702 of the implanted region 700. In some embodiments, the depth 1108 of the implanted region 1106 is greater than the depth 702 of the implanted region 700. In some embodiments, the depth 1108 of the implanted region 1106 is less than the depth 702 of the implanted region 700. In some embodiments, the relative difference between the depth 702 and the depth 1108 is about 10 nm to about 40 nm.

Figure 12:
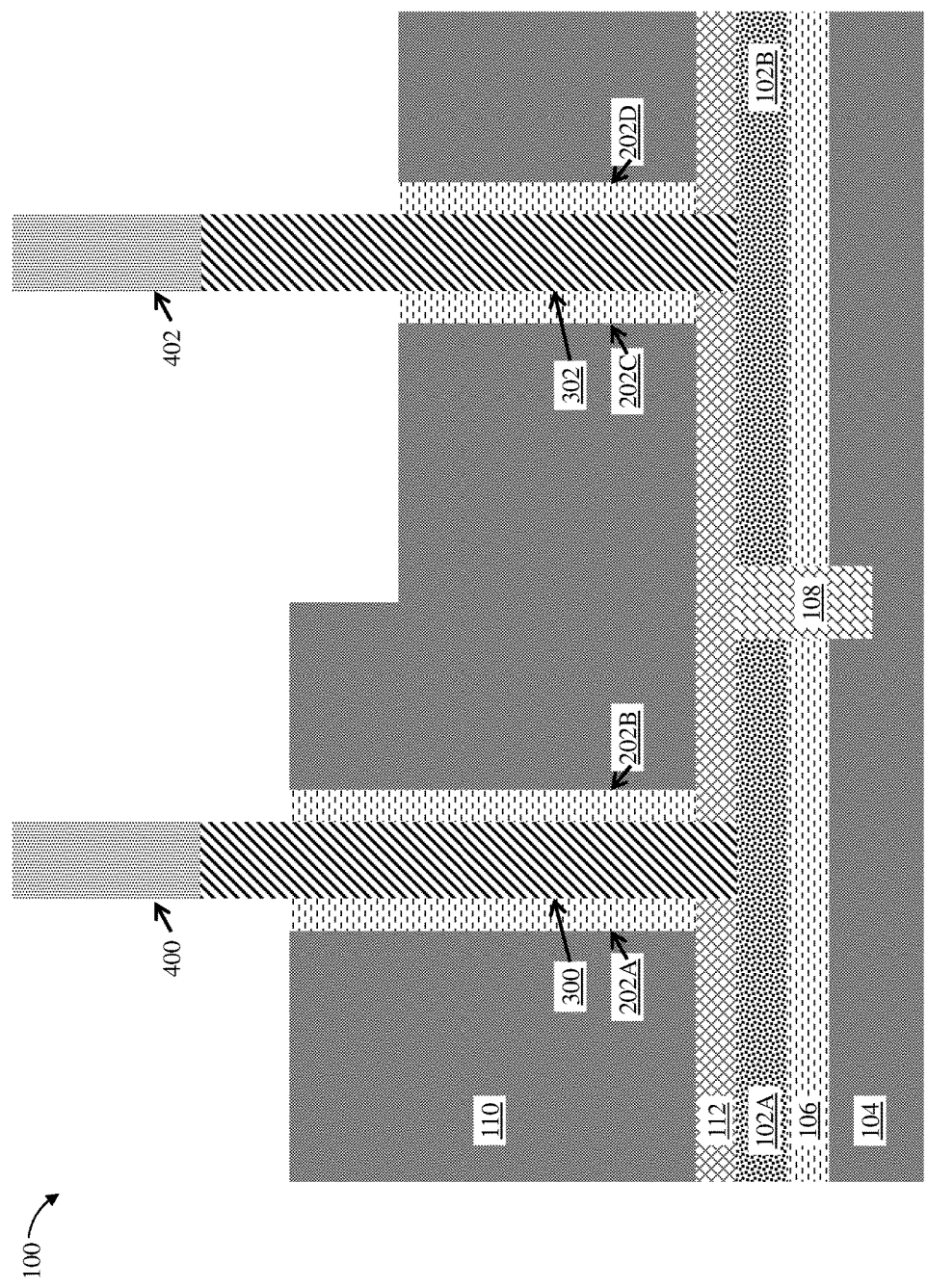
FIG. 12 depicts the cross-sectional view of the structure after removing the implanted region according to one or more embodiments of the present invention.

FIG. 12 illustrates a cross-sectional view of the structure 100 after removing the implanted region 700. Any known manner of removing the implanted region 700 can be utilized. In some embodiments, an etch process, which can be a wet etch process, a dry etch process or a combination thereof, is utilized. In some embodiments, the etch process is an HCl gas etch. In some embodiments, the etch process is a directional etch, such as a RIE, selective to the sacrificial gate 110. In some embodiments, the etch process is a wet etch process for selectively etching the implanted region 700.

Figure 13:
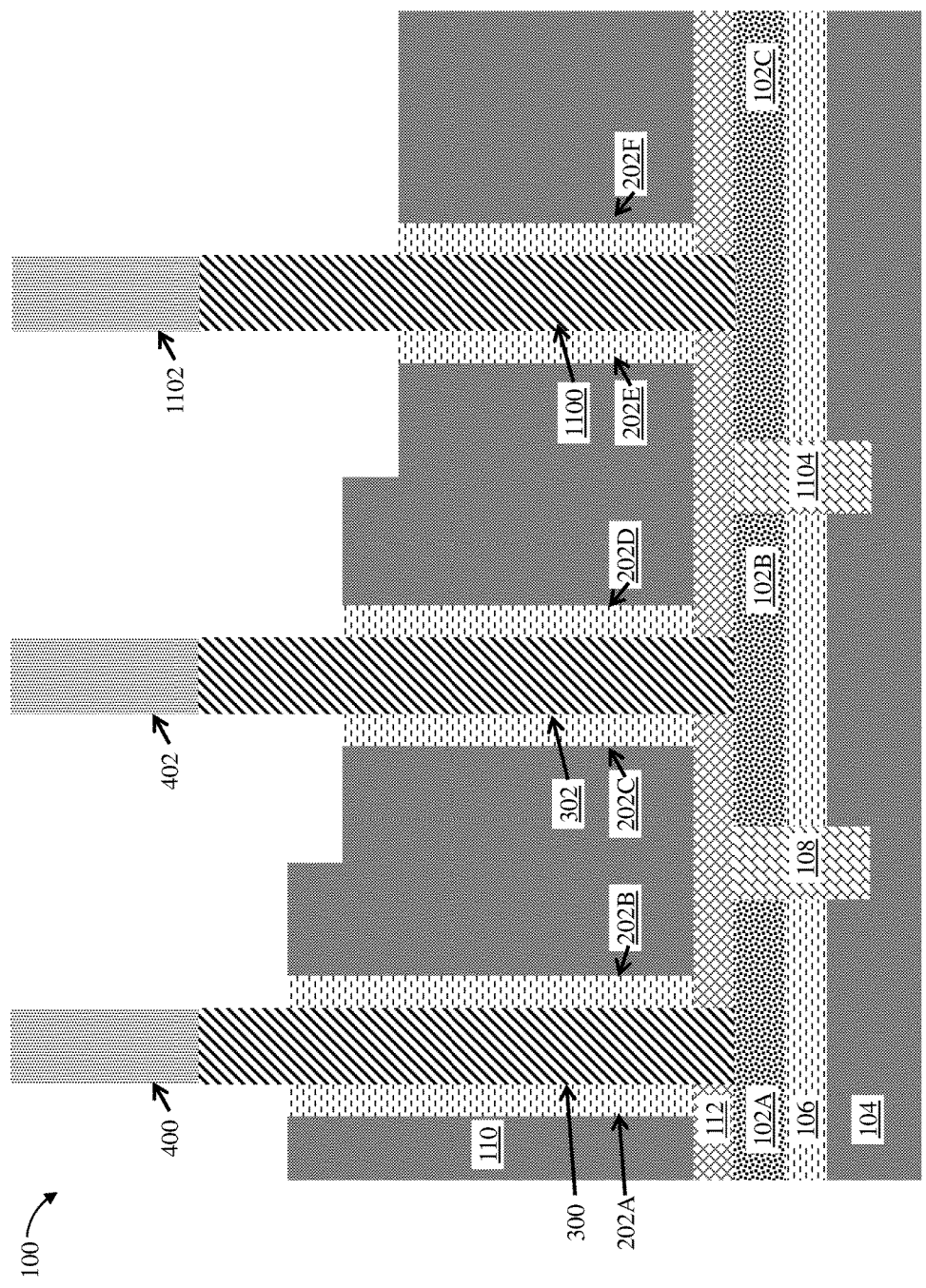
FIG. 13 depicts the extended cross-sectional view of the structure after removing the implanted region according to one or more embodiments of the present invention.

FIG. 13 illustrates an extended cross-sectional view of the structure 100 after removing the implanted regions 700 and 1106. The implanted region 1106 can be removed in like manner as the implanted region 700. In some embodiments, an etch process, which can be a wet etch process, a dry etch process or a combination thereof, is utilized. In some embodiments, the etch process is an HCl gas etch.

Figure 14:
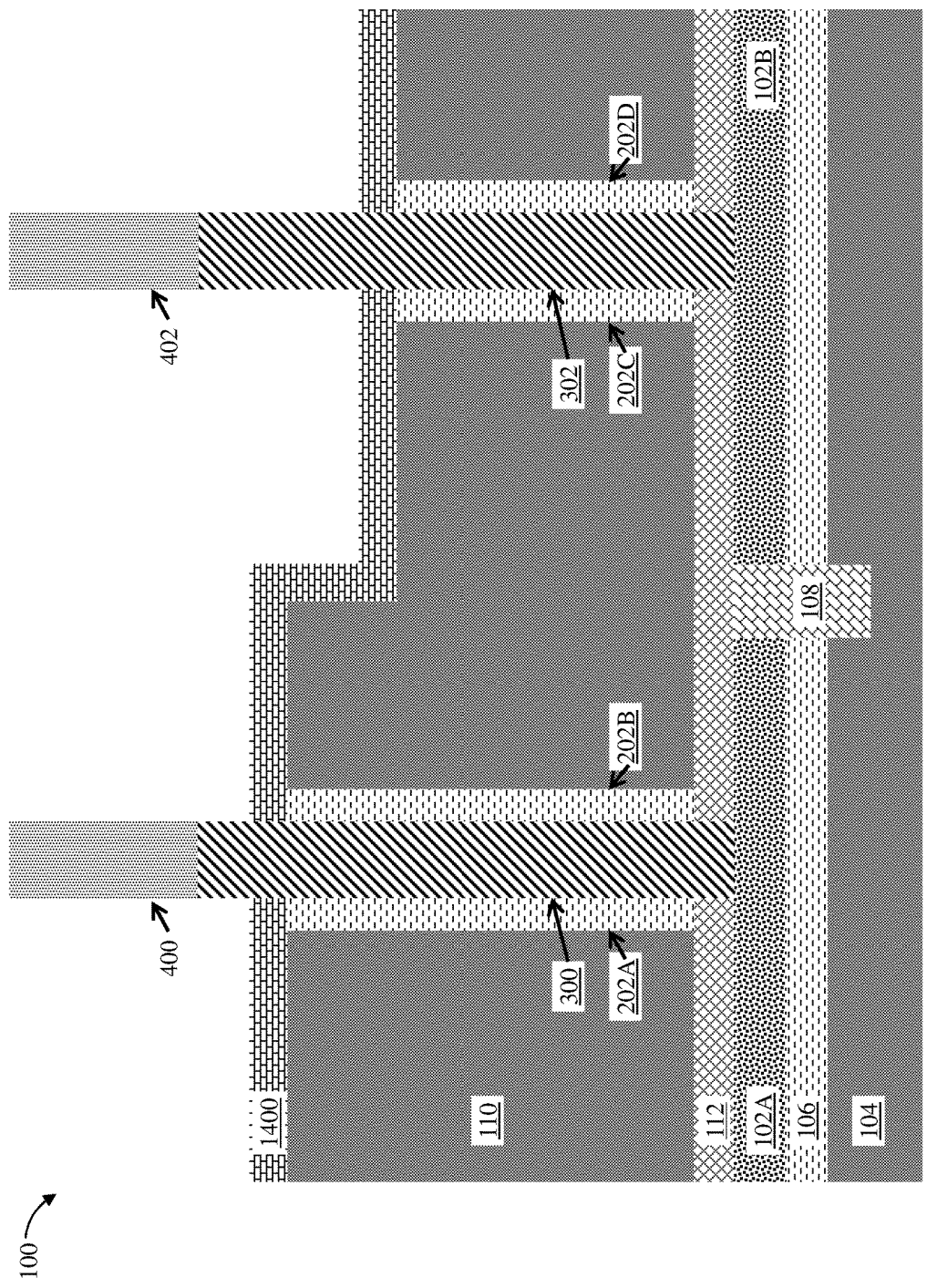
FIG. 14 depicts the cross-sectional view of the structure after removing forming a top spacer on the sacrificial gate according to one or more embodiments of the present invention.

FIG. 14 illustrates a cross-sectional view of the structure 100 after forming a top spacer 1400 on the sacrificial gate 110. Any known manner of forming the top spacer 1400 can be utilized. In some embodiments, the top spacer 1400 is deposited using CVD, PECVD, ALD, PVD, chemical solution deposition, or other like processes. The top spacer 1400 can be of any suitable material, such as, for example, a low-k dielectric, a nitride, silicon nitride, silicon dioxide, a silicon oxynitride (SiON), a silicon carbide (SiC), a silicon oxygen carbonitride (SiOCN), or a silicoboron carbonitride (SiBCN).

Figure 15:
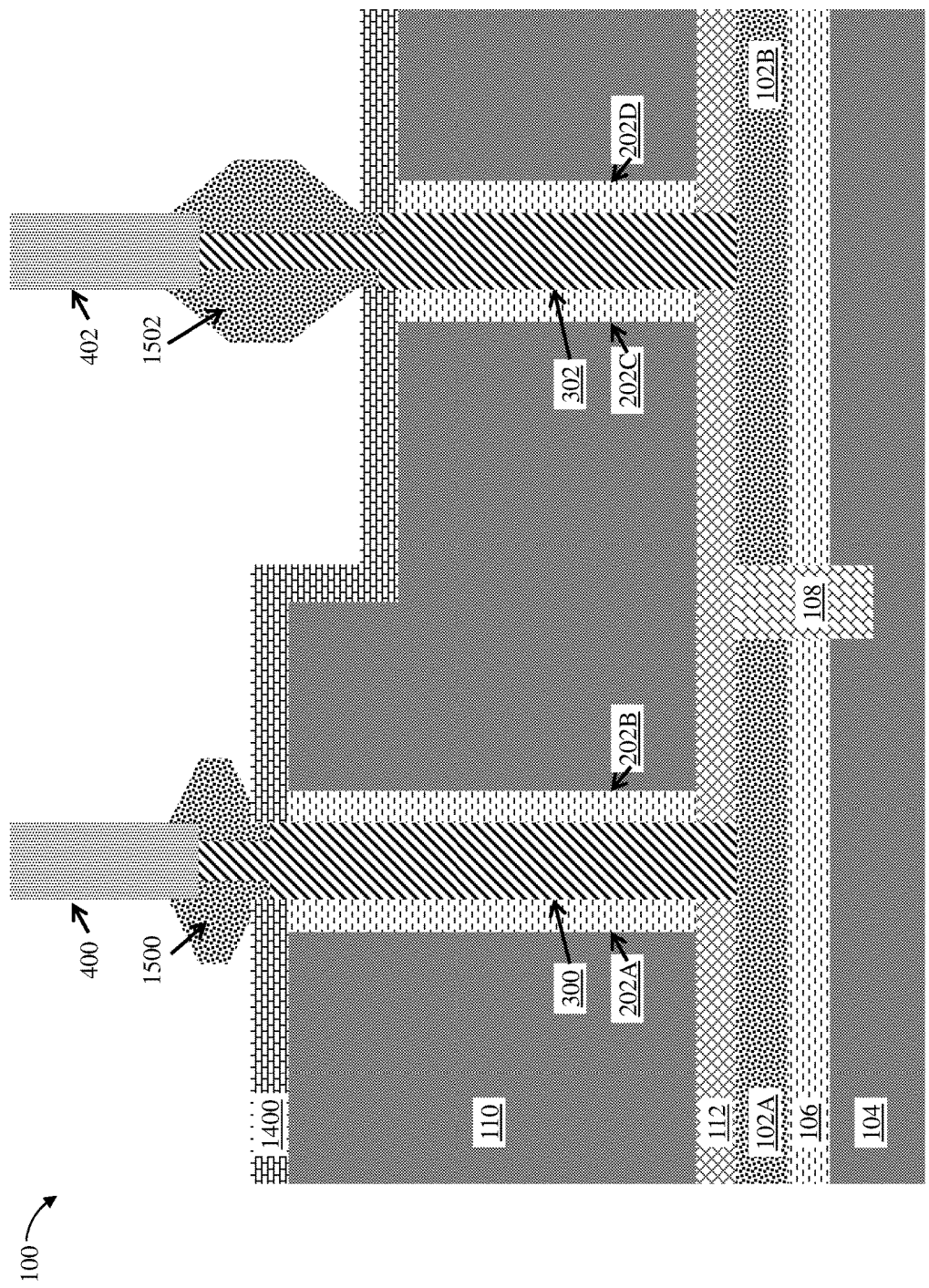
FIG. 15 depicts the cross-sectional view of the structure after forming top epitaxy regions on exposed portions of the semiconductor fins according to one or more embodiments of the present invention.

FIG. 15 illustrates a cross-sectional view of the structure 100 after forming a top epitaxy region 1500 on exposed portions of the semiconductor fin 300 and a top epitaxy region 1502 on exposed portions of the semiconductor fin 302. For ease of illustration only top epitaxy regions 1500 and 1502 are depicted. It is understood that a plurality of top epitaxy regions can be formed on a plurality of semiconductor fins. Any known manner of forming the top epitaxy region 700A can be utilized. In some embodiments, epitaxial growth, CVD, ECD, MBE, or ALD is employed to form the top epitaxy regions 1500 and 1502. In some embodiments, the top epitaxy regions 1500 and 1502 are in-situ doped. In some embodiments, the top epitaxy regions 1500 and 1502 are formed using ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), or molecular beam epitaxy (MBE). Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm-3 to $3 \times 10^{21}$ cm$^{-3}$, or preferably between $2 \times 10^{20}$ cm$^{-3}$ and $1.5 \times 10^{21}$ cm$^{-3}$.

Figure 16:
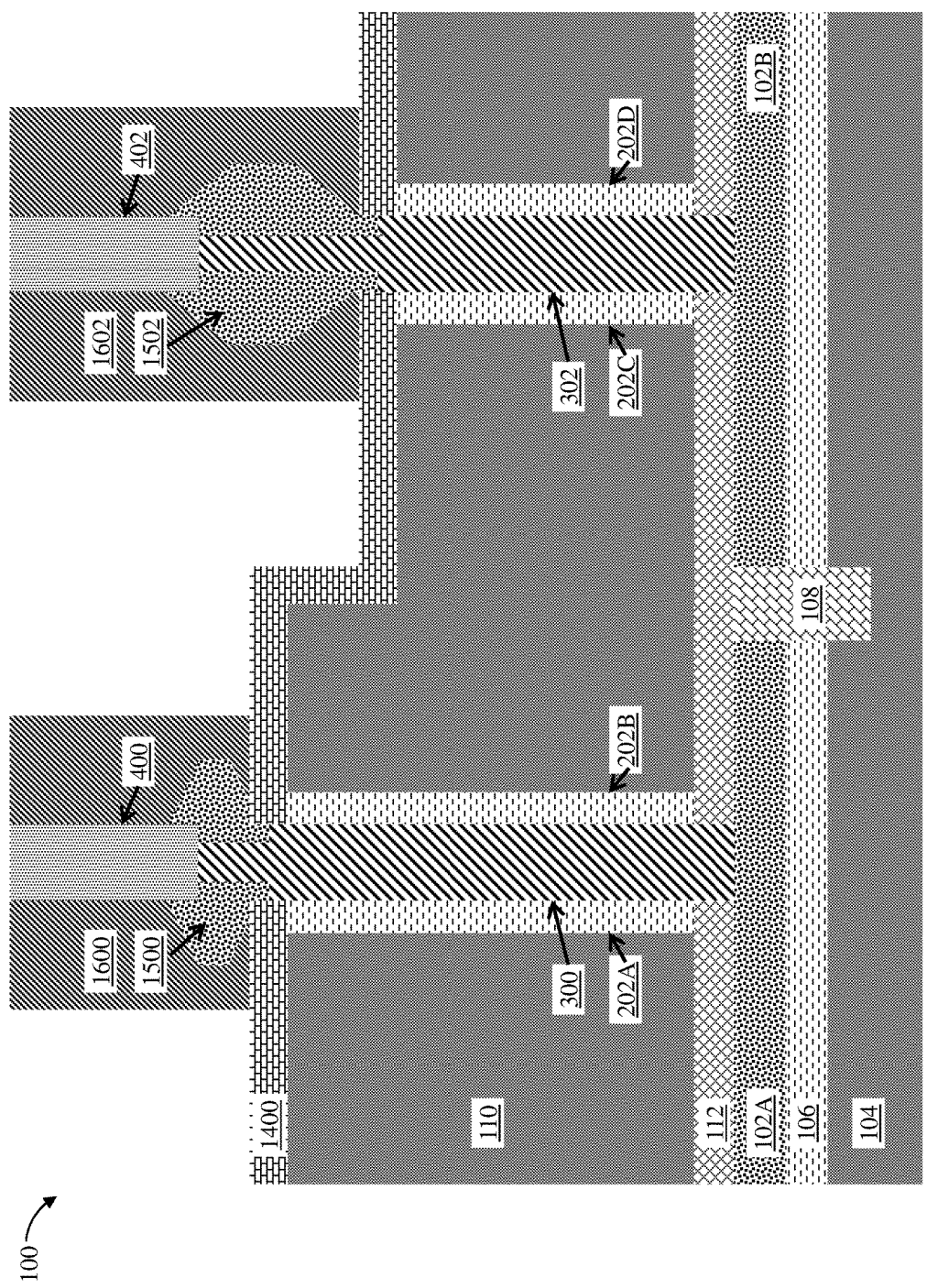
FIG. 16 depicts the cross-sectional view of the structure after forming spacers over the top epitaxy regions according to one or more embodiments of the present invention.

FIG. 16 illustrates a cross-sectional view of the structure 100 after forming a spacer 1600 over the top epitaxy region 1500 and a spacer 1602 over the top epitaxy region 1502. Any known composition and manner of forming the spacers 1600 and 1602 can be utilized. In some embodiments, the spacers 1600 and 1602 are a low-k dielectric, a nitride, silicon nitride, silicon dioxide, a silicon oxynitride (SiON), a silicon carbide (SiC), a silicon oxygen carbonitride (SiOCN), or a silicoboron carbonitride (SiBCN).

Figure 17:
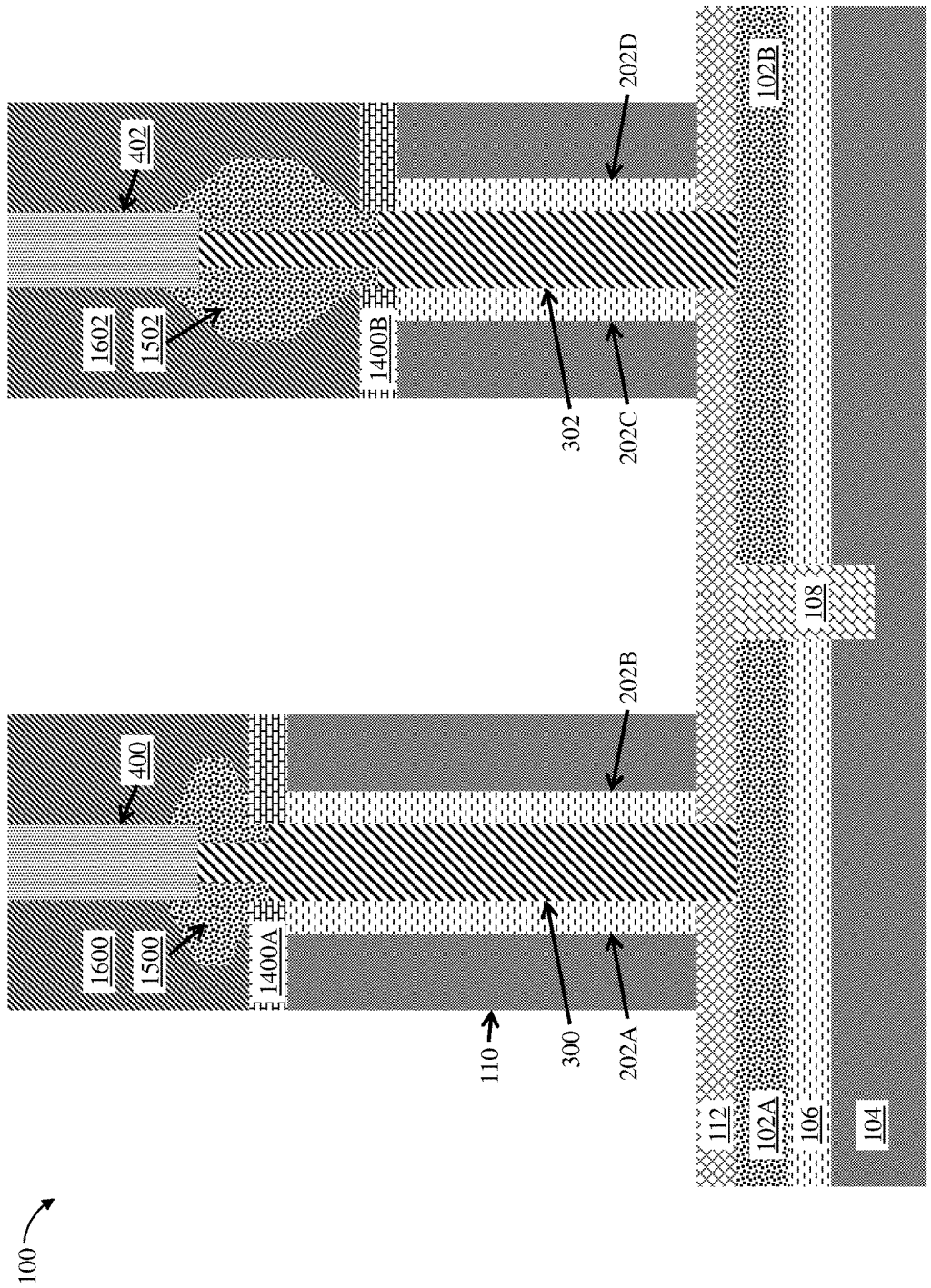
FIG. 17 depicts the cross-sectional view of the structure after removing portions of the top spacer and portions of the sacrificial gate to expose a surface of the bottom spacer according to one or more embodiments of the present invention.

FIG. 17 illustrates a cross-sectional view of the structure 100 after removing portions of the top spacer 1400 and portions of the sacrificial gate 110 to expose a surface of the bottom spacer 112. Any known manner of removing these portions can be utilized. In some embodiments, an etch process, which can be a wet etch process, a dry etch process or a combination thereof, is utilized. In some embodiments, the etch process is a directional etch, such as a RIE, selective to the bottom spacer 112. In some embodiments, the etch process is a series of directional etches (e.g., RIEs) having a final etch selective to the bottom spacer 112. Portions 1400A and 1400B of the top spacer 1400 adjacent to the semiconductor fins 300 and 302, respectfully, remain.

Figure 18:
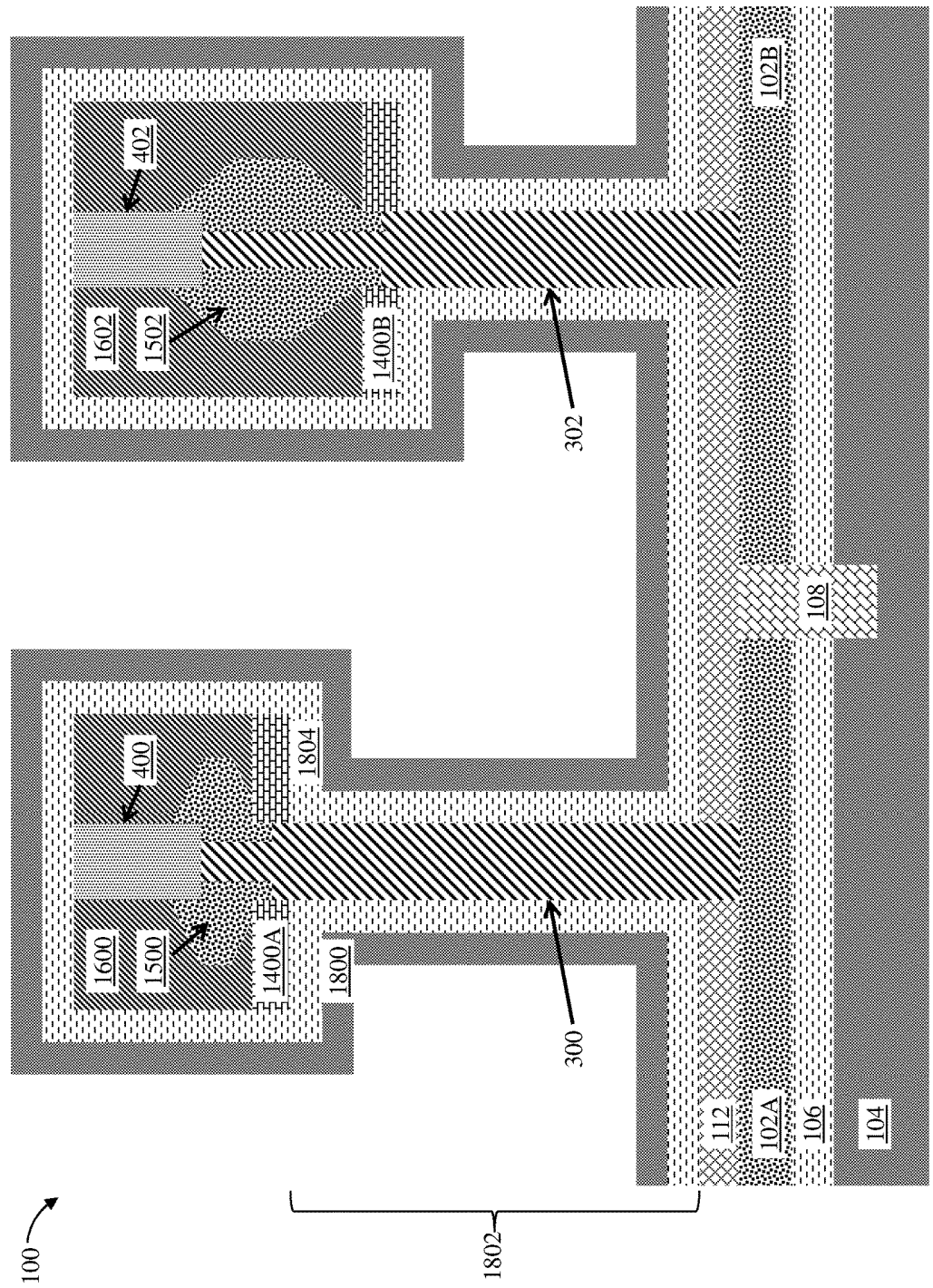
FIG. 18 depicts the cross-sectional view of the structure after removing remaining portions of the sacrificial gate and the thin oxide layers according to one or more embodiments of the present invention.

FIG. 18 illustrates a cross-sectional view of the structure 100 after removing remaining portions of the sacrificial gate 110 and the thin oxide layers 202A, 202B, 202C, and 202D. Any known manner of removing these portions can be utilized. In some embodiments, an etch process, which can be a wet etch process, a dry etch process or a combination thereof, is utilized. In some embodiments, the etch process is selective to the bottom spacer 112, the top spacer 1400 and the spacers 1600 and 1602.

Figure 20:
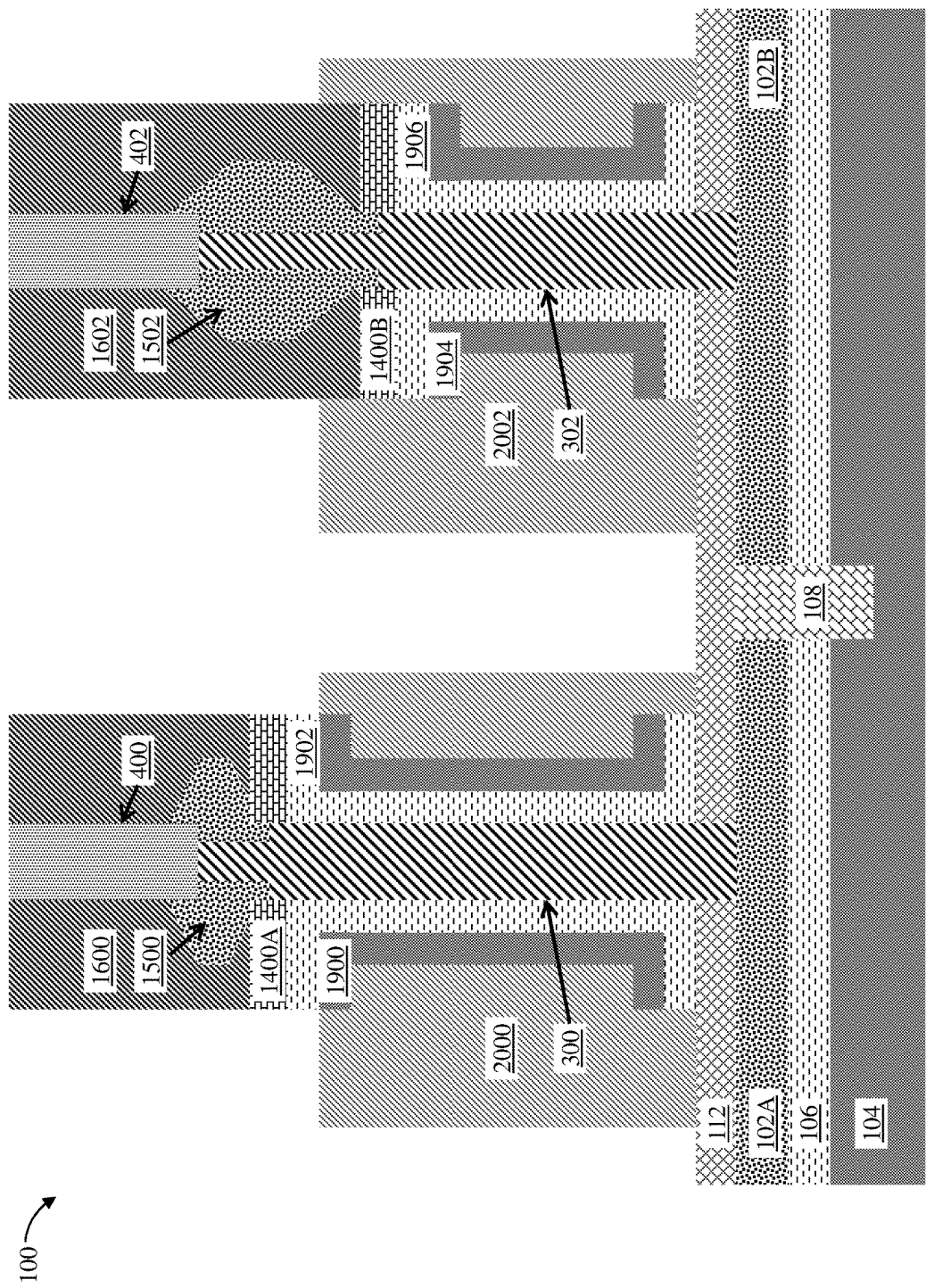
FIG. 20 depicts the cross-sectional view of the structure after forming a gate over the channel region of the semiconductor fin on the bottom spacer according to one or more embodiments of the present invention.

A gate dielectric (e.g., high-k dielectric) region 1800 is formed over a channel region 1802 of the semiconductor fin 300. For clarity, only the channel region 1802 is illustrated. It is understood that each semiconductor fin (e.g., 300, 302) also includes a channel region. The gate dielectric region 1800 defines a channel interface (e.g., channel region 1802) between the semiconductor fin 300 and a gate 2000 (as depicted in FIG. 20). A gate dielectric region can be formed between a gate and a semiconductor fin to modify the work function of the gate. Any known composition and manner of forming the gate dielectric region 1800 can be utilized. In some embodiments, the gate dielectric region 1800 is conformally formed over exposed portions of the structure 100 ("conformal" as used herein means that the thickness of the gate dielectric region 1800 is substantially the same on all surfaces, or that the thickness variation is less than 15% of the nominal thickness).

The gate dielectric region 1800 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the gate dielectric region 1800 can have a thickness of about 0.5 nm to about 4 nm. In some embodiments, the gate dielectric region 1800 can have a thickness of about 2 nm to about 3 nm.

In some embodiments, a work function (e.g., work function metal) layer 1804 is formed between the gate dielectric region 1800 and the semiconductor fin 300. The work function layer can be a nitride, including but not limited to titanium nitride (TiN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof, during an operation for forming a VFET, according to one or more embodiments.

Figure 19:
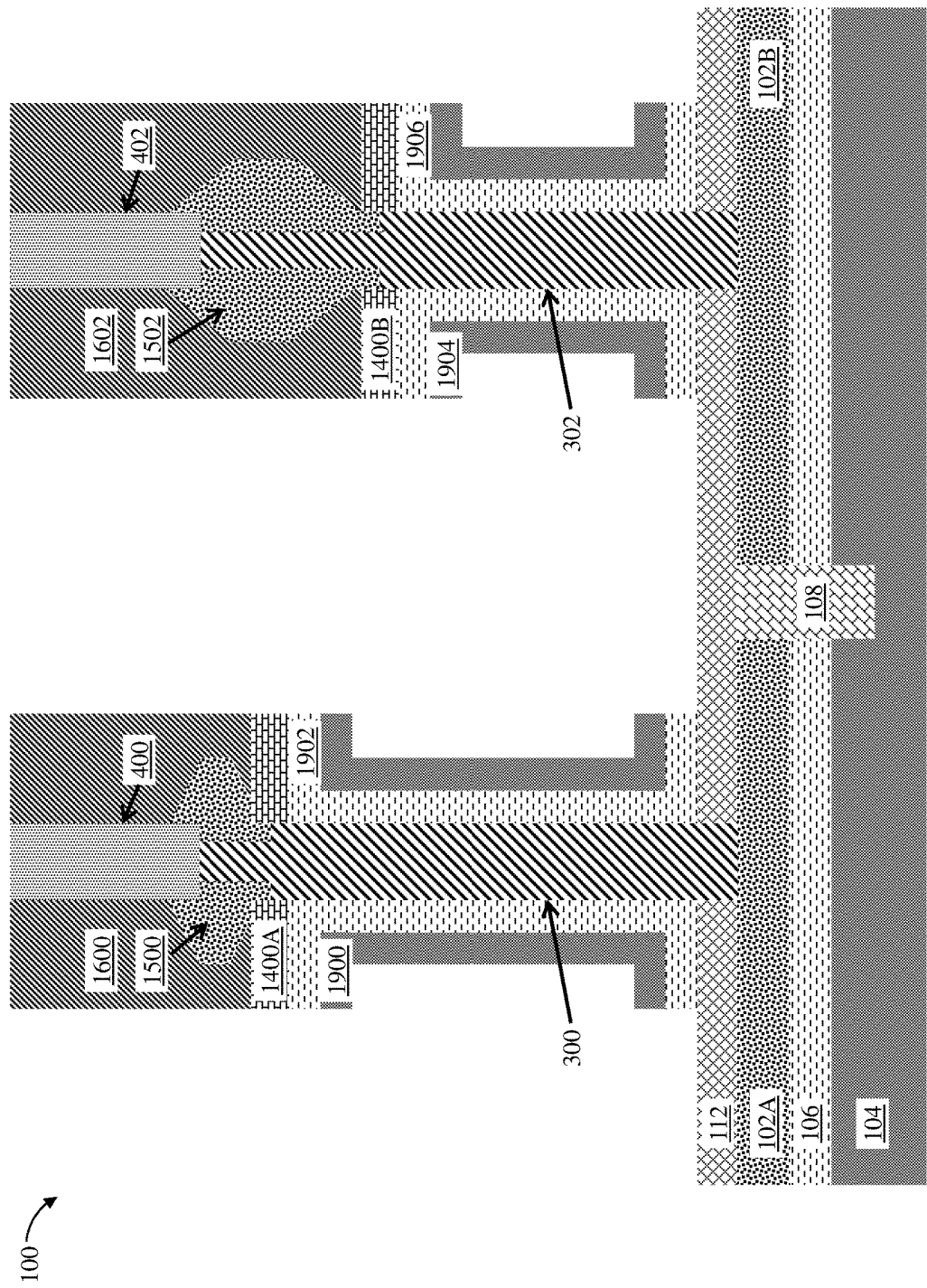
FIG. 19 depicts the cross-sectional view of the structure after removing portions of the gate dielectric region and portions of the work function layer to expose a surface of the bottom spacer and the spacers according to one or more embodiments of the present invention.

FIG. 19 illustrates a cross-sectional view of the structure 100 after removing portions of the gate dielectric region 1800 and portions of the work function layer 1804 to expose a surface of the bottom spacer 112 and the spacers 1600 and 1602. Any known manner of removing these portions can be utilized. In some embodiments, an anisotropic etch process is utilized. Portions 1900 of the gate dielectric region 1800 and 1902 of the work function layer 1804 remain adjacent to the semiconductor fin 300. Likewise, portions 1904 of the gate dielectric region 1800 and 1906 of the work function layer 1804 remain adjacent to the semiconductor fin 302.

FIG. 20 illustrates a cross-sectional view of the structure 100 after forming a gate 2000 over the channel region 1802 of the semiconductor fin 300 on the bottom spacer 112. In like manner, a gate 2002 is formed over a channel region of the semiconductor fin 302. Any known composition and manner of forming the gates 2000 and 2002 can be utilized. The gates 2000 and 2002 (sometimes referred to as gate conductors) can be made of, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The gates 2000 and 2002 can be formed, for example, by a lithographic patterning and RIE of a bulk gate material (not illustrated). In some embodiments, the bulk gate material can be deposited during a metal filling operation. In some embodiments, the bulk gate material is planarized to a surface of the spacers 1600 and 1602 and recessed to expose portions of the top spacer 1400A of the semiconductor fin 300 prior to being lithographically patterned and etched.

Figure 21:
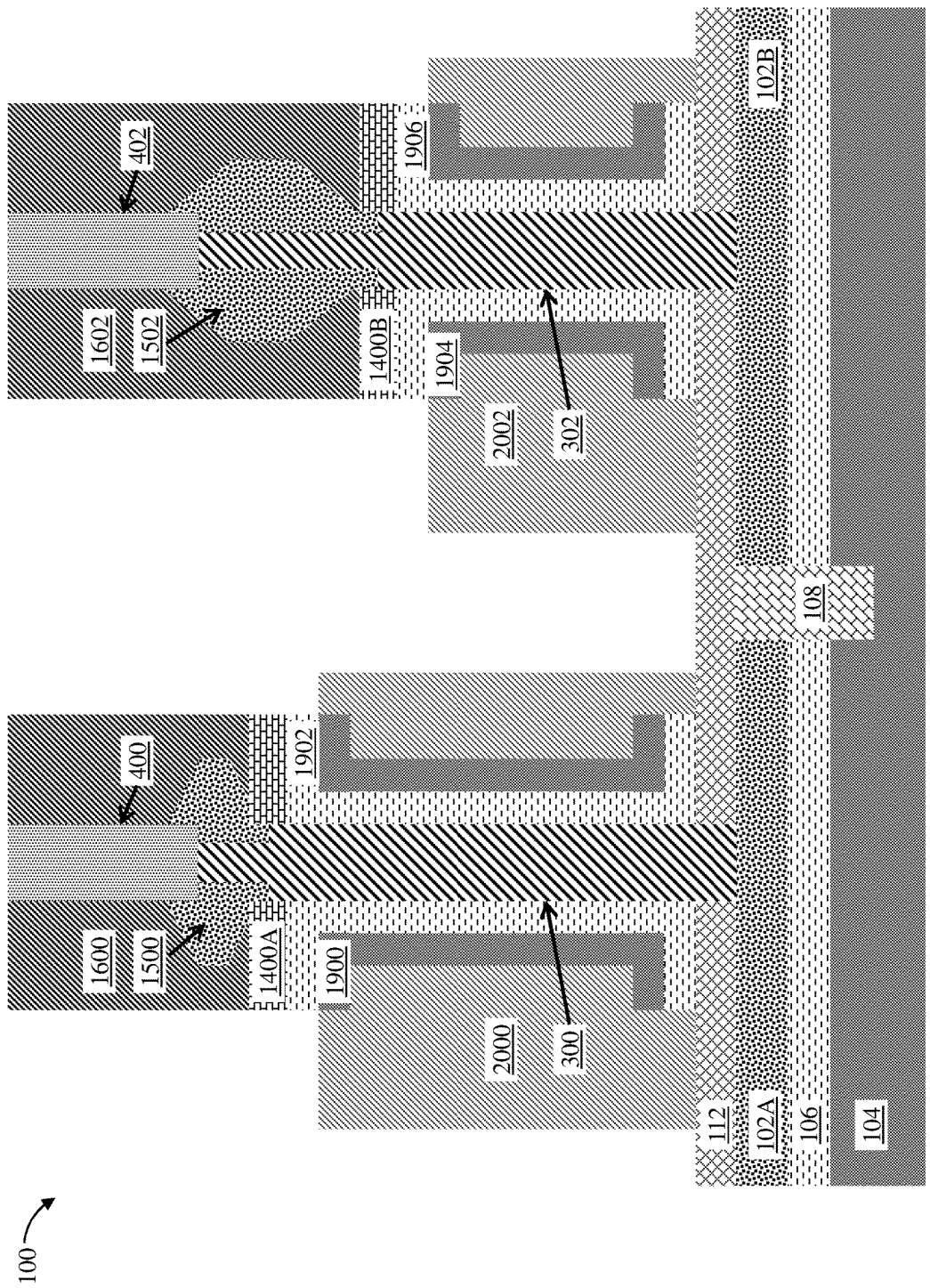
FIG. 21 depicts the cross-sectional view of the structure during an intermediate operation of a method of fabricating a semiconductor device according to one or more embodiments whereby a first gate is lithographically patterned to a different height than the a second gate according to one or more embodiments of the present invention.

FIG. 21 illustrates a cross-sectional view of the structure 100 during an intermediate operation of a method of fabricating a semiconductor device according to one or more embodiments whereby the gate 2002 is lithographically patterned to a different height than the gate 2000. In some embodiments, the gate 2002 is recessed to expose portions of the top spacer 1400B of the semiconductor fin 302. For ease of illustration only gates 2000 and 2002 are depicted. It is understood that a plurality of gates can each be lithographically patterned to a plurality of heights, each gate height corresponding to a channel length of a semiconductor fin of a plurality of semiconductor fins. Patterning each gate to a height corresponding to a channel length of each semiconductor fin advantageously reduces the parasitic capacitance between the gate material and the top epitaxy regions.

As discussed in detail herein, the channel length of each semiconductor fin can be controlled by adjusting an implant energy of an ion implantation process to form an implanted region in the sacrificial gate 110, removing the implanted region, and forming a top spacer 1400 (as is depicted for semiconductor fin 302 in FIGS. 7, 12, and 14, respectfully). Moreover, as the depth of each implanted region is a function of the implant energy of the corresponding implantation process, the gate length for each semiconductor fin is freed from the limits of photolithography and is instead precisely controlled by adjusting the implant energy for each implantation process.

Figure 22:
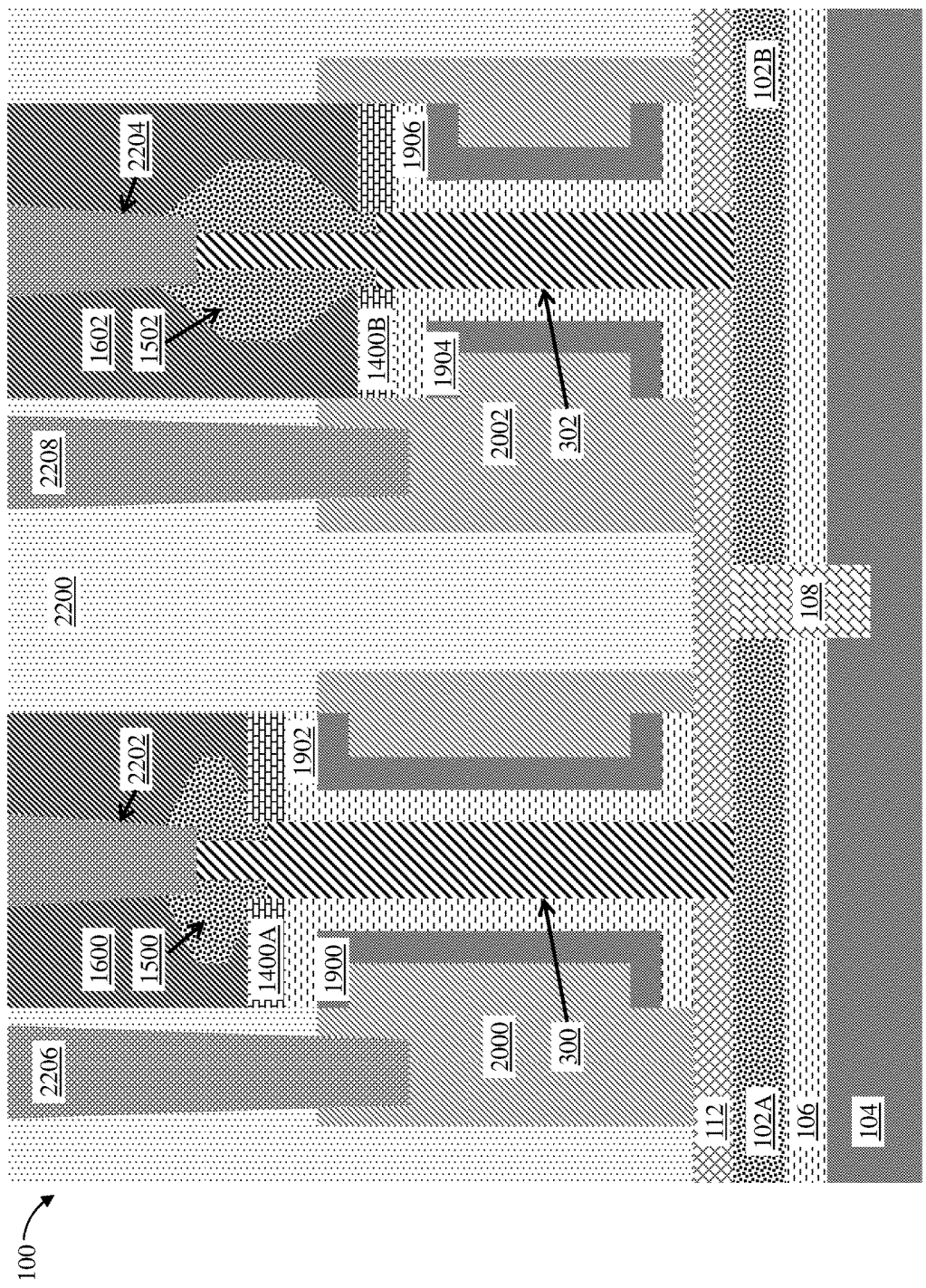
FIG. 22 depicts the cross-sectional view of the structure after forming an interlayer dielectric (ILD) over the structure according to one or more embodiments of the present invention.

FIG. 22 illustrates a cross-sectional view of the structure 100 after forming an interlayer dielectric (ILD) 2200 over the structure 100. Any known manner of forming the ILD 2200 can be utilized. In some embodiments, the ILD 2200 is deposited by a spin-on coating operation. The ILD 2200 can be any suitable dielectric material, such as, for example, an oxide. In some embodiments, the ILD 2200 is silicon dioxide ($SiO_2$).

A first epitaxy contact 2202 is formed in the spacer 1600 contacting the top epitaxy region 1500 and a second epitaxy contact 2204 is formed in the spacer 1602 contacting the top epitaxy region 1502. The first and second epitaxy contacts 2202 and 2204 can be of any suitable conducting material, such as, for example, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. Any known manner of forming the first and second epitaxy contacts 2202 and 2204 can be utilized. In some embodiments, the epitaxy contacts can be copper and can include a barrier metal liner. In some embodiments, the hard masks 400 and 402 are removed to form trenches and the barrier metal liner is deposited into the trenches prior to depositing the contacts into the trenches (not illustrated). The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

A first gate contact 2206 is formed in the ILD 2200 contacting the gate 2000 and a second gate contact 2208 is formed in the ILD 2200 contacting the gate 2002. The first and second gate contacts 2206 and 2208 can be formed in a like manner and composition as the first and second epitaxy contacts 2202 and 2204. In some embodiments, a patterned photomask is formed on the ILD 2200. The patterned photomask exposes portions of the ILD 2200 for selective removal. In some embodiments, gate contact trenches (not illustrated) are formed by a series of directional etches (e.g., RIEs). In some embodiments, the first and second gate contacts 2206 and 2008 are overfilled into the gate contact trenches to each form an overburden above a surface of the ILD 2200. In some embodiments, a CMP selective to the ILD 2200 removes the overburden.

Figure 23:
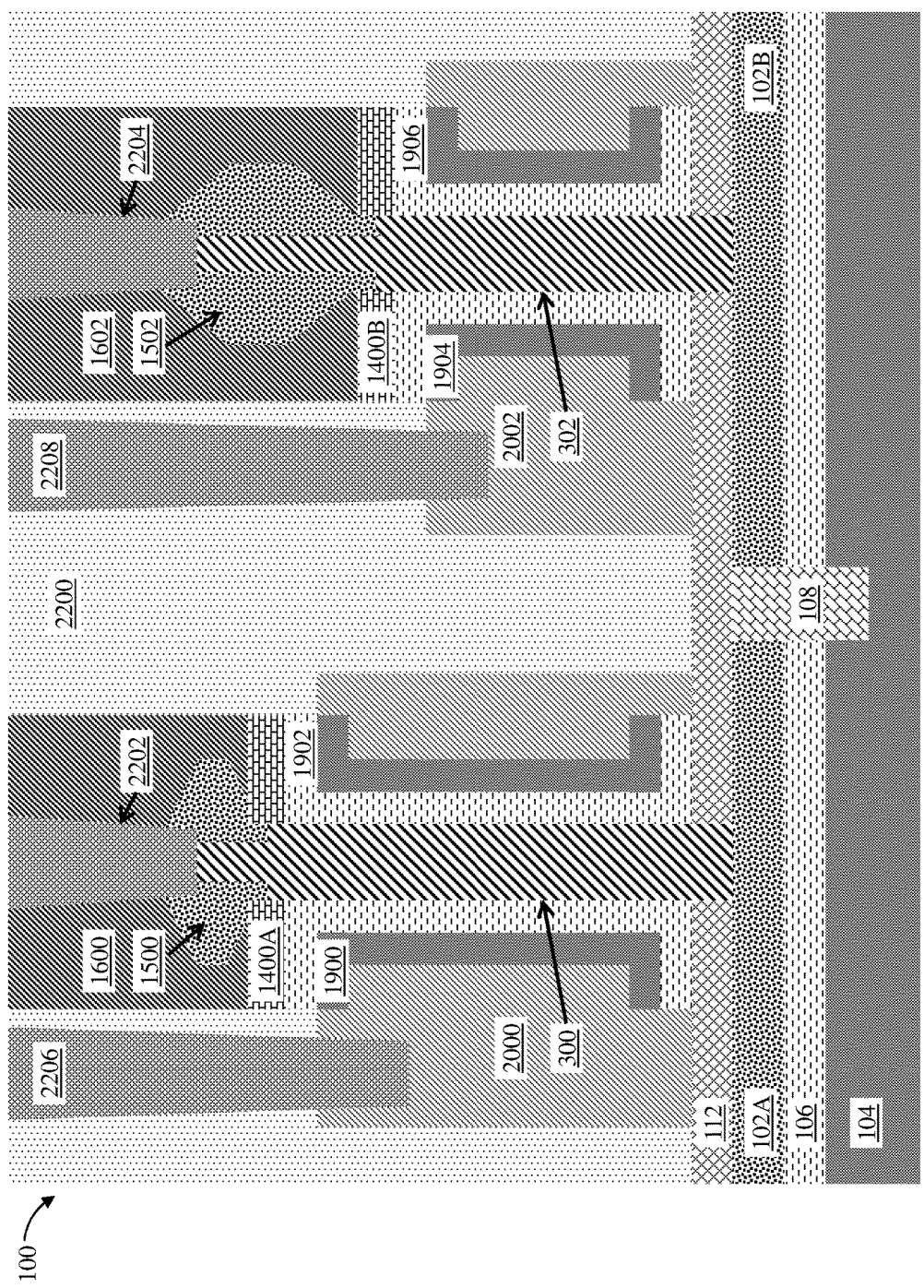
FIG. 23 depicts the cross-sectional view of the structure after forming gate and epitaxy contacts during an intermediate operation of a method of fabricating a semiconductor device according to one or more embodiments of the present invention.

FIG. 23 illustrates a cross-sectional view of the structure 100 after forming gate and epitaxy contacts during an intermediate operation of a method of fabricating a semiconductor device according to one or more embodiments. The gate 2002 is lithographically patterned to a different height than the gate 2000 (as is depicted in FIG. 21).

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:
    forming a sacrificial gate over a channel region of a semiconductor fin, the sacrificial gate comprising a first material;
    converting the first material in a first portion of the sacrificial gate adjacent to the semiconductor fin to a second material, the first portion having a first depth; and
    removing the first portion of the sacrificial gate.

2. The method of claim 1, further comprising:
    implanting arsenic into the first portion of the sacrificial gate to the first depth;
    wherein the first material is amorphous silicon;
    wherein the second material is arsenic doped silicon.

3. The method of claim 2, wherein implanting arsenic further comprises an arsenic ion implantation dose of about $1.00 \times 10^{15}$ ions/$cm^{-2}$ to about $2.00 \times 10^{16}$ ions/$cm^{-2}$.

4. The method of claim 2, wherein implanting arsenic further comprises an arsenic ion implantation dose having a first implant energy selected to achieve the first depth.

5. The method of claim 1, wherein the first depth is about 10 nm to about 40 nm.

6. The method of claim 1, further comprising:
    forming the sacrificial gate over a channel region of a second semiconductor fin;
    converting the first material in a second portion of the sacrificial gate adjacent to the second semiconductor fin to the second material, the second portion having a second depth; and
    removing the second portion of the sacrificial gate;
    wherein the first depth is different than the second depth.

7. The method of claim 6, wherein the first depth is about 10 nm and the second depth is about 40 nm.

8. The method of claim 6, wherein the difference between the first depth and the second depth is about 10 nm to about 40 nm.

9. The method of claim 1, further comprising:
    implanting germanium into the first portion of the sacrificial gate to the first depth;
    wherein the first material is amorphous silicon;
    wherein the second material is germanium doped silicon.

10. The method of claim 9, wherein implanting germanium further comprises a germanium ion implantation dose of about $1.00 \times 10^{16}$ ions/$cm^{-2}$ to about $2.00 \times 10^{17}$ ions/$cm^{-2}$.

11. A method for forming a semiconductor device, the method comprising:
    forming a sacrificial gate over a channel region of a first semiconductor fin and a channel region of a second semiconductor fin, the sacrificial gate comprising a first material;
    converting the first material in a first portion of the sacrificial gate adjacent to the first semiconductor fin to a second material, the first portion having a first depth;
    converting the first material in a second portion of the sacrificial gate adjacent to the second semiconductor fin to the second material, the second portion having a second depth; and removing the first portion and the second portion of the sacrificial gate;

wherein the first depth and the second depth are different.

12. The method of claim 11, further comprising:

implanting arsenic into the first portion of the sacrificial gate to the first depth; and implanting arsenic into the second portion of the sacrificial gate to the second depth;

wherein the first material is amorphous silicon;

wherein the second material is arsenic doped silicon.

13. The method of claim 12, wherein implanting arsenic further comprises an arsenic ion implantation dose of about $1.00 \times 10^{15}$ ions/cm$^{-2}$ to about $2.00 \times 10^{16}$ ions/cm$^{-2}$.

14. The method of claim 12, wherein implanting arsenic into the first portion of the sacrificial gate to the first depth further comprises an arsenic ion implantation dose having a first implant energy selected to achieve the first depth; and wherein implanting arsenic into the second portion of the sacrificial gate to the second depth further comprises an arsenic ion implantation dose having a second implant energy selected to achieve the second depth.

15. The method of claim 11, wherein the difference between the first depth and the second depth is about 10 nm to about 40 nm.

16. The method of claim 11, further comprising:

implanting germanium into the first portion of the sacrificial gate to the first depth; and implanting germanium into the second portion of the sacrificial gate to the second depth;

wherein the first material is amorphous silicon;

wherein the second material is germanium doped silicon.

* * * * *